United States Patent
Nixon et al.

(10) Patent No.: US 10,296,668 B2
(45) Date of Patent: *May 21, 2019

(54) DATA MODELING STUDIO

(71) Applicant: FISHER-ROSEMOUNT SYSTEMS, INC., Round Rock, TX (US)

(72) Inventors: Mark J. Nixon, Round Rock, TX (US); Terrence L. Blevins, Round Rock, TX (US); Daniel Dean Christensen, Austin, TX (US); Paul Richard Muston, Narborough (GB); Ken Beoughter, Round Rock, TX (US)

(73) Assignee: FISHER-ROSEMOUNT SYSTEMS, INC., Round Rock, TX (US)

( * ) Notice: Subject to any disclaimer, the term of this patent is extended or adjusted under 35 U.S.C. 154(b) by 126 days.

This patent is subject to a terminal disclaimer.

(21) Appl. No.: 14/216,774

(22) Filed: Mar. 17, 2014

(65) Prior Publication Data

US 2014/0282227 A1    Sep. 18, 2014

Related U.S. Application Data

(60) Provisional application No. 61/798,820, filed on Mar. 15, 2013.

(51) Int. Cl.
*G06F 17/50* (2006.01)
*G06F 3/0482* (2013.01)
(Continued)

(52) U.S. Cl.
CPC ........ *G06F 17/5009* (2013.01); *G06F 3/0482* (2013.01); *G06F 3/04842* (2013.01);
(Continued)

(58) Field of Classification Search
CPC ............... G06F 3/0482; G06F 3/04855; G06F 3/04842; G06F 17/5009; G06F 9/4436; G06F 8/34; G06F 8/36; G05B 2219/23258

See application file for complete search history.

(56) References Cited

U.S. PATENT DOCUMENTS

| 4,451,047 A | 5/1984 | Herd et al. |
|---|---|---|
| 4,593,367 A | 6/1986 | Slack et al. |

(Continued)

FOREIGN PATENT DOCUMENTS

| AU | 2010257310 A1 | 7/2012 |
|---|---|---|
| CN | 1409179 A | 4/2003 |

(Continued)

OTHER PUBLICATIONS

Woo, "Intel Drops a Big Data Shocker", downloaded from the Internet at: <http://forbes.com/sites/bwoo/2013/02/27/intel-drops-a-big-data-shocker/?partner—ya> dated Feb. 27, 2013.

(Continued)

*Primary Examiner* — Shen Shiau
(74) *Attorney, Agent, or Firm* — Marshall, Gerstein & Borun LLP

(57) ABSTRACT

A data modeling studio provides a structured environment for graphically creating and executing models which may be configured for diagnosis, prognosis, analysis, identifying relationships, etc., within a process plant. The data modeling studio includes a configuration engine for generating user interface elements to facilitate graphical construction of a model and a runtime engine for executing data models in, for example, an offline or an on-line environment. The configuration engine includes an interface routine that generates user interface elements, a plurality of templates stored in memory that serve as the building blocks of the model and a model compiler that converts the graphical model into a (Continued)

data format executable by the run-time engine. The run time engine executes the model to produce the desired output and may include a retrieval routine for retrieving data corresponding to the templates from memory and a modeling routine for executing the executable model.

11 Claims, 9 Drawing Sheets

(51) Int. Cl.
*G06F 3/0484* (2013.01)
*G06F 3/0485* (2013.01)
*G06F 8/34* (2018.01)
*G06F 9/448* (2018.01)
*G06F 8/36* (2018.01)

(52) U.S. Cl.
CPC ............ *G06F 3/04855* (2013.01); *G06F 8/34* (2013.01); *G05B 2219/23258* (2013.01); *G06F 8/36* (2013.01); *G06F 9/4494* (2018.02)

(56) References Cited

U.S. PATENT DOCUMENTS

| | | |
|---|---|---|
| 4,901,221 A | 2/1990 | Kodosky et al. |
| 4,914,568 A | 4/1990 | Kodosky et al. |
| 5,111,531 A | 5/1992 | Grayson et al. |
| 5,164,897 A | 11/1992 | Clark et al. |
| 5,291,587 A | 3/1994 | Kodosky et al. |
| 5,301,301 A | 4/1994 | Kodosky et al. |
| 5,301,336 A | 4/1994 | Kodosky et al. |
| 5,475,851 A | 12/1995 | Kodosky et al. |
| 5,481,740 A | 1/1996 | Kodosky |
| 5,481,741 A | 1/1996 | McKaskle et al. |
| 5,497,500 A | 3/1996 | Rogers et al. |
| 5,544,320 A | 8/1996 | Konrad |
| 5,568,491 A | 10/1996 | Beal et al. |
| 5,598,572 A | 1/1997 | Tanikoshi et al. |
| 5,610,828 A | 3/1997 | Kodosky et al. |
| 5,652,909 A | 7/1997 | Kodosky |
| D384,050 S | 9/1997 | Kodosky |
| D384,051 S | 9/1997 | Kodosky |
| D384,052 S | 9/1997 | Kodosky |
| D387,750 S | 12/1997 | Kodosky |
| 5,732,277 A | 3/1998 | Kodosky et al. |
| 5,734,863 A | 3/1998 | Kodosky et al. |
| 5,737,622 A | 4/1998 | Rogers et al. |
| 5,801,942 A | 9/1998 | Nixon et al. |
| 5,801,946 A | 9/1998 | Nissen et al. |
| 5,821,934 A | 10/1998 | Kodosky et al. |
| 5,828,851 A | 10/1998 | Nixon et al. |
| 5,838,563 A | 11/1998 | Dove et al. |
| 5,856,931 A | 1/1999 | McCasland |
| 5,862,052 A | 1/1999 | Nixon et al. |
| 5,862,054 A | 1/1999 | Li |
| 5,909,368 A | 6/1999 | Nixon et al. |
| 5,917,489 A | 6/1999 | Thurlow et al. |
| 5,940,294 A | 8/1999 | Dove |
| 5,971,747 A | 10/1999 | Lemelson et al. |
| 5,980,078 A | 11/1999 | Krivoshein et al. |
| 5,987,246 A | 11/1999 | Thomsen et al. |
| 5,988,847 A | 11/1999 | McLaughlin et al. |
| 5,990,906 A | 11/1999 | Hudson et al. |
| 5,995,916 A | 11/1999 | Nixon et al. |
| 6,009,422 A | 12/1999 | Ciccarelli |
| 6,032,208 A | 2/2000 | Nixon et al. |
| 6,064,409 A | 5/2000 | Thomsen et al. |
| 6,078,320 A | 6/2000 | Dove et al. |
| 6,098,116 A | 8/2000 | Nixon et al. |
| 6,167,464 A | 12/2000 | Kretschmann |
| 6,173,438 B1 | 1/2001 | Kodosky et al. |
| 6,178,504 B1 | 1/2001 | Fieres et al. |
| 6,195,591 B1 | 2/2001 | Nixon et al. |
| 6,219,628 B1 | 4/2001 | Kodosky et al. |
| 6,266,726 B1 | 7/2001 | Nixon et al. |
| 6,278,374 B1 | 8/2001 | Ganeshan |
| 6,285,966 B1 | 9/2001 | Brown et al. |
| 6,295,513 B1 | 9/2001 | Thackston |
| 6,324,877 B2 | 12/2001 | Neeley |
| 6,347,253 B1 | 2/2002 | Fujita et al. |
| 6,421,570 B1 | 7/2002 | McLaughlin et al. |
| 6,442,515 B1 | 8/2002 | Varma et al. |
| 6,463,352 B1 | 10/2002 | Tadokoro et al. |
| 6,529,780 B1 | 3/2003 | Soergel et al. |
| 6,535,883 B1 | 3/2003 | Lee et al. |
| 6,563,430 B1 | 5/2003 | Kemink et al. |
| 6,584,601 B1 | 6/2003 | Kodosky et al. |
| 6,608,638 B1 | 8/2003 | Kodosky et al. |
| 6,609,036 B1 | 8/2003 | Bickford |
| 6,658,114 B1 | 12/2003 | Farn et al. |
| 6,701,285 B2 | 3/2004 | Salonen |
| 6,715,078 B1 | 3/2004 | Chasko et al. |
| 6,715,139 B1 | 3/2004 | Kodosky et al. |
| 6,763,515 B1 | 7/2004 | Vazquez et al. |
| 6,768,116 B1 | 7/2004 | Berman et al. |
| 6,772,017 B1 | 8/2004 | Dove et al. |
| 6,784,903 B2 | 8/2004 | Kodosky et al. |
| 6,847,850 B2 | 1/2005 | Grumelart |
| 6,868,538 B1 | 3/2005 | Nixon et al. |
| 6,917,839 B2 | 7/2005 | Bickford |
| 6,934,667 B2 | 8/2005 | Kodosky et al. |
| 6,934,668 B2 | 8/2005 | Kodosky et al. |
| 6,954,724 B2 | 10/2005 | Kodosky et al. |
| 6,961,686 B2 | 11/2005 | Kodosky et al. |
| 6,965,886 B2 | 11/2005 | Govrin et al. |
| 6,970,758 B1 | 11/2005 | Shi et al. |
| 6,971,066 B2 | 11/2005 | Schultz et al. |
| 6,983,228 B2 | 1/2006 | Kodosky et al. |
| 6,993,466 B2 | 1/2006 | Kodosky et al. |
| 7,000,190 B2 | 2/2006 | Kudukoli et al. |
| 7,006,881 B1 | 2/2006 | Hoffberg et al. |
| 7,010,470 B2 | 3/2006 | Kodosky et al. |
| 7,062,718 B2 | 6/2006 | Kodosky et al. |
| 7,072,722 B1 | 7/2006 | Colonna et al. |
| 7,123,974 B1 | 10/2006 | Hamilton |
| 7,134,086 B2 | 11/2006 | Kodosky |
| 7,134,090 B2 | 11/2006 | Kodosky et al. |
| 7,143,149 B2 | 11/2006 | Oberg et al. |
| 7,143,289 B2 | 11/2006 | Denning et al. |
| 7,177,786 B2 | 2/2007 | Kodosky et al. |
| 7,185,287 B2 | 2/2007 | Ghercioiu et al. |
| 7,200,838 B2 | 4/2007 | Kodosky et al. |
| 7,210,117 B2 | 4/2007 | Kudukoli et al. |
| 7,213,057 B2 | 5/2007 | Trethewey et al. |
| 7,216,334 B2 | 5/2007 | Kodosky et al. |
| 7,219,306 B2 | 5/2007 | Kodosky et al. |
| 7,222,131 B1 | 5/2007 | Grewal et al. |
| 7,283,914 B2 | 10/2007 | Poorman et al. |
| 7,283,971 B1 | 10/2007 | Levine et al. |
| 7,302,675 B2 | 11/2007 | Rogers et al. |
| 7,314,169 B1 | 1/2008 | Jasper et al. |
| 7,340,737 B2 | 3/2008 | Ghercioiu et al. |
| 7,343,605 B2 | 3/2008 | Langkafel et al. |
| 7,346,404 B2 | 3/2008 | Eryurek et al. |
| 7,367,028 B2 | 4/2008 | Kodosky et al. |
| 7,478,337 B2 | 1/2009 | Kodosky et al. |
| 7,506,304 B2 | 3/2009 | Morrow et al. |
| 7,530,052 B2 | 5/2009 | Morrow et al. |
| 7,530,113 B2 | 5/2009 | Braun |
| 7,536,548 B1 | 5/2009 | Batke et al. |
| RE40,817 E | 6/2009 | Krivoshein et al. |
| 7,541,920 B2 | 6/2009 | Tambascio et al. |
| 7,548,873 B2 | 6/2009 | Veeningen et al. |
| 7,558,711 B2 | 7/2009 | Kodosky et al. |
| 7,565,306 B2 | 7/2009 | Apostolides |
| 7,574,690 B2 | 8/2009 | Shah et al. |
| 7,594,220 B2 | 9/2009 | Kodosky et al. |
| 7,598,856 B1 | 10/2009 | Nick et al. |
| 7,606,681 B2 | 10/2009 | Esmaili et al. |
| 7,616,095 B2 | 11/2009 | Jones et al. |
| 7,617,542 B2 | 11/2009 | Vataja |
| 7,627,860 B2 | 12/2009 | Kodosky et al. |

(56) References Cited

U.S. PATENT DOCUMENTS

| | | |
|---|---|---|
| 7,630,914 B2 | 12/2009 | Veeningen et al. |
| 7,640,007 B2 | 12/2009 | Chen et al. |
| 7,644,052 B1 | 1/2010 | Chang et al. |
| 7,650,264 B2 | 1/2010 | Kodosky et al. |
| 7,653,563 B2 | 1/2010 | Veeningen et al. |
| 7,668,608 B2 | 2/2010 | Nixon et al. |
| 7,676,281 B2 | 3/2010 | Hood et al. |
| 7,680,546 B2 | 3/2010 | Gilbert et al. |
| 7,684,877 B2 | 3/2010 | Weatherhead et al. |
| RE41,228 E | 4/2010 | Kodosky et al. |
| 7,694,273 B2 | 4/2010 | Kodosky et al. |
| 7,707,014 B2 | 4/2010 | Kodosky et al. |
| 7,715,929 B2 | 5/2010 | Skourup et al. |
| 7,716,489 B1 | 5/2010 | Brandt et al. |
| 7,720,727 B2 | 5/2010 | Keyes et al. |
| 7,818,715 B2 | 10/2010 | Kodosky et al. |
| 7,818,716 B2 | 10/2010 | Kodosky et al. |
| 7,827,122 B1 | 11/2010 | Campbell, Jr. et al. |
| 7,831,914 B2 | 11/2010 | Kodosky et al. |
| 7,844,908 B2 | 11/2010 | Kodosky et al. |
| 7,853,431 B2 | 12/2010 | Samardzija et al. |
| 7,865,349 B2 | 1/2011 | Kodosky et al. |
| 7,882,490 B2 | 2/2011 | Kodosky et al. |
| 7,882,491 B2 | 2/2011 | Kodosky et al. |
| 7,925,979 B2 | 4/2011 | Forney et al. |
| 7,930,639 B2 | 4/2011 | Baier et al. |
| 7,934,095 B2 | 4/2011 | Laberteaux et al. |
| 7,937,665 B1 | 5/2011 | Vazquez et al. |
| 7,962,440 B2 | 6/2011 | Baier et al. |
| 7,978,059 B2 | 7/2011 | Petite et al. |
| 7,979,843 B2 | 7/2011 | Kodosky et al. |
| 7,984,423 B2 | 7/2011 | Kodosky et al. |
| 7,987,448 B2 | 7/2011 | Kodosky et al. |
| 8,014,722 B2 | 9/2011 | Abel et al. |
| 8,028,241 B2 | 9/2011 | Kodosky et al. |
| 8,028,242 B2 | 9/2011 | Kodosky et al. |
| 8,055,787 B2 | 11/2011 | Victor et al. |
| 8,060,834 B2 | 11/2011 | Lucas et al. |
| 8,073,967 B2 | 12/2011 | Peterson et al. |
| 8,074,201 B2 | 12/2011 | Ghercioiu et al. |
| 8,099,712 B2 | 1/2012 | Kodosky et al. |
| 8,102,400 B1 | 1/2012 | Cook et al. |
| 8,126,964 B2 | 2/2012 | Pretlove et al. |
| 8,132,225 B2 | 3/2012 | Chand et al. |
| 8,146,053 B2 | 3/2012 | Morrow et al. |
| 8,166,296 B2 | 4/2012 | Buer et al. |
| 8,171,137 B1 | 5/2012 | Parks et al. |
| 8,185,217 B2 | 5/2012 | Thiele |
| 8,185,495 B2 | 5/2012 | Clark et al. |
| 8,185,832 B2 | 5/2012 | Kodosky et al. |
| 8,185,833 B2 | 5/2012 | Kodosky et al. |
| 8,185,871 B2 | 5/2012 | Nixon et al. |
| 8,190,888 B2 | 5/2012 | Batke et al. |
| 8,191,005 B2 | 5/2012 | Baier et al. |
| 8,214,455 B2 | 7/2012 | Baier et al. |
| 8,218,651 B1 | 7/2012 | Eshet et al. |
| 8,219,669 B2 | 7/2012 | Agrusa et al. |
| 8,224,496 B2 | 7/2012 | Musti et al. |
| 8,239,848 B2 | 8/2012 | Ghercioiu et al. |
| 8,266,066 B1 | 9/2012 | Wezter et al. |
| 8,290,762 B2 | 10/2012 | Kodosky et al. |
| 8,307,330 B2 | 11/2012 | Kumar et al. |
| 8,316,313 B2 | 11/2012 | Campney et al. |
| 8,321,663 B2 | 11/2012 | Medvinsky et al. |
| 8,327,130 B2 | 12/2012 | Wilkinson, Jr. et al. |
| 8,350,666 B2 | 1/2013 | Kore |
| 8,359,567 B2 | 1/2013 | Kornerup et al. |
| 8,397,172 B2 | 3/2013 | Kodosky et al. |
| 8,397,205 B2 | 3/2013 | Kornerup et al. |
| 8,413,118 B2 | 4/2013 | Kodosky et al. |
| 8,417,360 B2 | 4/2013 | Sustaeta et al. |
| 8,417,595 B2 | 4/2013 | Keyes et al. |
| 8,418,071 B2 | 4/2013 | Kodosky et al. |
| 8,429,627 B2 | 4/2013 | Jedlicka et al. |
| 8,448,135 B2 | 5/2013 | Kodosky |
| 8,521,332 B2 | 8/2013 | Tiemann et al. |
| 8,532,795 B2 | 9/2013 | Adavi et al. |
| 8,570,922 B2 | 10/2013 | Pratt, Jr. et al. |
| 8,612,870 B2 | 12/2013 | Kodosky et al. |
| 8,624,725 B1 | 1/2014 | MacGregor |
| 8,656,351 B2 | 2/2014 | Kodosky et al. |
| 8,688,780 B2 | 4/2014 | Gordon et al. |
| 8,781,776 B2 | 7/2014 | Onda et al. |
| 8,832,236 B2 | 9/2014 | Hernandez et al. |
| 8,943,469 B2 | 1/2015 | Kumar et al. |
| 8,977,851 B2 | 3/2015 | Neitzel et al. |
| 9,002,973 B2 | 4/2015 | Panther |
| 9,021,021 B2 | 4/2015 | Backholm et al. |
| 9,024,972 B1 | 5/2015 | Bronder et al. |
| 9,038,043 B1 | 5/2015 | Fleetwood et al. |
| 9,047,007 B2 | 6/2015 | Kodosky et al. |
| 9,088,665 B2 | 7/2015 | Boyer et al. |
| 9,098,164 B2 | 8/2015 | Kodosky |
| 9,110,558 B2 | 8/2015 | Kodosky |
| 9,119,166 B1 | 8/2015 | Sheikh |
| 9,122,764 B2 | 9/2015 | Neitzel et al. |
| 9,122,786 B2 | 9/2015 | Cammert et al. |
| 9,134,895 B2 | 9/2015 | Dove et al. |
| 9,229,871 B2 | 1/2016 | Washiro |
| 9,235,395 B2 | 1/2016 | Kodosky et al. |
| 9,244,452 B2 * | 1/2016 | Brandes ............... G05B 19/0426 |
| 9,338,218 B1 | 5/2016 | Florissi et al. |
| 9,361,320 B1 | 6/2016 | Vijendra et al. |
| 9,397,836 B2 | 7/2016 | Nixon et al. |
| 9,424,398 B1 | 8/2016 | McLeod et al. |
| 9,430,114 B1 | 8/2016 | Dingman et al. |
| 9,459,809 B1 | 10/2016 | Chen et al. |
| 9,532,232 B2 | 12/2016 | Dewey et al. |
| 9,541,905 B2 | 1/2017 | Nixon et al. |
| 9,558,220 B2 | 1/2017 | Nixon et al. |
| 9,652,213 B2 | 5/2017 | MacCleery et al. |
| 9,678,484 B2 | 6/2017 | Nixon et al. |
| 9,697,170 B2 | 7/2017 | Nixon et al. |
| 9,804,588 B2 | 10/2017 | Blevins et al. |
| 9,892,353 B1 | 2/2018 | Lui et al. |
| 2002/0010694 A1 | 1/2002 | Navab et al. |
| 2002/0035495 A1 | 3/2002 | Spira et al. |
| 2002/0052715 A1 | 5/2002 | Maki |
| 2002/0054130 A1 | 5/2002 | Abbott et al. |
| 2002/0064138 A1 | 5/2002 | Saito et al. |
| 2002/0080174 A1 | 6/2002 | Kodosky et al. |
| 2002/0087419 A1 | 7/2002 | Andersson et al. |
| 2002/0094085 A1 | 7/2002 | Roberts |
| 2002/0120475 A1 | 8/2002 | Morimoto |
| 2002/0128998 A1 | 9/2002 | Kil et al. |
| 2002/0130846 A1 | 9/2002 | Nixon et al. |
| 2002/0138168 A1 | 9/2002 | Salonen |
| 2002/0138320 A1 | 9/2002 | Robertson et al. |
| 2002/0149497 A1 | 10/2002 | Jaggi |
| 2002/0159441 A1 | 10/2002 | Travaly et al. |
| 2002/0169514 A1 | 11/2002 | Eryurek et al. |
| 2003/0020726 A1 | 1/2003 | Charpentier |
| 2003/0023795 A1 | 1/2003 | Packwood et al. |
| 2003/0028495 A1 | 2/2003 | Pallante |
| 2003/0061295 A1 | 3/2003 | Oberg et al. |
| 2003/0083756 A1 | 5/2003 | Hsiung et al. |
| 2003/0084053 A1 | 5/2003 | Govrin et al. |
| 2003/0093309 A1 | 5/2003 | Tanikoshi et al. |
| 2003/0147351 A1 | 8/2003 | Greenlee |
| 2003/0154044 A1 | 8/2003 | Lundstedt et al. |
| 2003/0195934 A1 | 10/2003 | Peterson et al. |
| 2004/0005859 A1 * | 1/2004 | Ghercioiu ................. G06F 8/60 |
| | | 455/3.01 |
| 2004/0012632 A1 | 1/2004 | King et al. |
| 2004/0014479 A1 | 1/2004 | Milman |
| 2004/0075689 A1 * | 4/2004 | Schleiss ................. G05B 15/02 |
| | | 715/771 |
| 2004/0093102 A1 | 5/2004 | Liiri et al. |
| 2004/0117233 A1 | 6/2004 | Rapp |
| 2004/0133457 A1 | 7/2004 | Sadiq et al. |
| 2004/0153437 A1 | 8/2004 | Buchan |
| 2004/0153804 A1 * | 8/2004 | Blevins ................. G05B 15/02 |
| | | 714/33 |
| 2004/0203874 A1 | 10/2004 | Brandt et al. |

(56) References Cited

U.S. PATENT DOCUMENTS

| | | |
|---|---|---|
| 2004/0204775 A1 | 10/2004 | Keyes et al. |
| 2004/0210330 A1 | 10/2004 | Birkle |
| 2004/0230328 A1 | 11/2004 | Armstrong et al. |
| 2004/0233930 A1 | 11/2004 | Colby |
| 2005/0005259 A1 | 1/2005 | Avery et al. |
| 2005/0060111 A1 | 3/2005 | Ramillon et al. |
| 2005/0062677 A1 | 3/2005 | Nixon et al. |
| 2005/0080799 A1 | 4/2005 | Harnden et al. |
| 2005/0096872 A1* | 5/2005 | Blevins ............... G05B 17/02 702/183 |
| 2005/0130634 A1 | 6/2005 | Godfrey |
| 2005/0164684 A1 | 7/2005 | Chen et al. |
| 2005/0182650 A1 | 8/2005 | Maddox et al. |
| 2005/0187649 A1 | 8/2005 | Funk et al. |
| 2005/0213768 A1 | 9/2005 | Durham et al. |
| 2005/0222691 A1 | 10/2005 | Glas et al. |
| 2005/0222698 A1* | 10/2005 | Eryurek ............... G06F 8/34 700/90 |
| 2005/0264527 A1 | 12/2005 | Lin |
| 2006/0031826 A1 | 2/2006 | Hiramatsu et al. |
| 2006/0064291 A1 | 3/2006 | Pattipatti et al. |
| 2006/0064472 A1 | 3/2006 | Mirho |
| 2006/0069717 A1 | 3/2006 | Mamou et al. |
| 2006/0087402 A1 | 4/2006 | Manning et al. |
| 2006/0168396 A1 | 7/2006 | LaMothe et al. |
| 2006/0200260 A1 | 9/2006 | Hoffberg et al. |
| 2006/0200771 A1 | 9/2006 | Nielsen et al. |
| 2006/0218107 A1 | 9/2006 | Young |
| 2006/0235741 A1 | 10/2006 | Deaton et al. |
| 2006/0241792 A1 | 10/2006 | Pretlove et al. |
| 2006/0288091 A1 | 12/2006 | Oh et al. |
| 2006/0291481 A1 | 12/2006 | Kumar |
| 2006/0294087 A1 | 12/2006 | Mordvinov |
| 2007/0005266 A1* | 1/2007 | Blevins ............... G05B 17/02 702/22 |
| 2007/0014406 A1 | 1/2007 | Scheidt et al. |
| 2007/0038889 A1 | 2/2007 | Wiggins et al. |
| 2007/0067725 A1 | 3/2007 | Cahill et al. |
| 2007/0078696 A1 | 4/2007 | Hardin |
| 2007/0112574 A1 | 5/2007 | Greene |
| 2007/0118516 A1 | 5/2007 | Li et al. |
| 2007/0130310 A1 | 6/2007 | Batke et al. |
| 2007/0130572 A1 | 6/2007 | Gilbert et al. |
| 2007/0132779 A1 | 6/2007 | Gilbert et al. |
| 2007/0139441 A1* | 6/2007 | Lucas ............... G05B 19/0426 345/619 |
| 2007/0179645 A1 | 8/2007 | Nixon et al. |
| 2007/0185754 A1 | 8/2007 | Schmidt |
| 2007/0211079 A1 | 9/2007 | Nixon et al. |
| 2007/0239292 A1 | 10/2007 | Ehrman et al. |
| 2007/0250292 A1 | 10/2007 | Alagappan et al. |
| 2007/0265801 A1 | 11/2007 | Foslien et al. |
| 2007/0265866 A1 | 11/2007 | Fehling et al. |
| 2008/0040719 A1 | 2/2008 | Shimizu et al. |
| 2008/0046104 A1 | 2/2008 | Van Camp et al. |
| 2008/0058968 A1 | 3/2008 | Sharma et al. |
| 2008/0065243 A1 | 3/2008 | Fallman et al. |
| 2008/0065705 A1* | 3/2008 | Miller ............... G05B 21/02 |
| 2008/0065706 A1* | 3/2008 | Miller ............... G05B 15/02 |
| 2008/0076431 A1 | 3/2008 | Fletcher et al. |
| 2008/0078189 A1 | 4/2008 | Ando |
| 2008/0079596 A1 | 4/2008 | Baier et al. |
| 2008/0082180 A1 | 4/2008 | Blevins et al. |
| 2008/0082181 A1 | 4/2008 | Miller et al. |
| 2008/0082195 A1 | 4/2008 | Samardzija |
| 2008/0097622 A1 | 4/2008 | Forney et al. |
| 2008/0103843 A1 | 5/2008 | Goeppert et al. |
| 2008/0104189 A1 | 5/2008 | Baker et al. |
| 2008/0125912 A1 | 5/2008 | Heilman et al. |
| 2008/0126352 A1 | 5/2008 | Case |
| 2008/0126665 A1 | 5/2008 | Burr et al. |
| 2008/0143482 A1 | 6/2008 | Shoarinejad et al. |
| 2008/0174766 A1 | 7/2008 | Haaslahti et al. |
| 2008/0182592 A1 | 7/2008 | Cha et al. |
| 2008/0209443 A1 | 8/2008 | Suzuki |
| 2008/0249641 A1* | 10/2008 | Enver ............... G05B 19/042 700/9 |
| 2008/0274766 A1 | 11/2008 | Pratt et al. |
| 2008/0275971 A1 | 11/2008 | Pretlove et al. |
| 2008/0288321 A1 | 11/2008 | Dillon et al. |
| 2008/0297513 A1 | 12/2008 | Greenhill et al. |
| 2008/0301123 A1 | 12/2008 | Schneider et al. |
| 2009/0049073 A1 | 2/2009 | Cho |
| 2009/0065578 A1 | 3/2009 | Peterson et al. |
| 2009/0070337 A1 | 3/2009 | Romem et al. |
| 2009/0070589 A1 | 3/2009 | Nayak et al. |
| 2009/0089233 A1 | 4/2009 | Gach et al. |
| 2009/0089359 A1* | 4/2009 | Siorek ............... G05B 19/4186 709/202 |
| 2009/0089709 A1 | 4/2009 | Baier et al. |
| 2009/0094531 A1 | 4/2009 | Danieli et al. |
| 2009/0097502 A1 | 4/2009 | Yamamoto |
| 2009/0112335 A1 | 4/2009 | Mehta et al. |
| 2009/0112532 A1 | 4/2009 | Foslien et al. |
| 2009/0210386 A1 | 8/2009 | Cahill |
| 2009/0210802 A1 | 8/2009 | Hawkins et al. |
| 2009/0210814 A1 | 8/2009 | Agrusa et al. |
| 2009/0216341 A1 | 8/2009 | Enkerud et al. |
| 2009/0249237 A1 | 10/2009 | Jundt et al. |
| 2009/0284383 A1 | 11/2009 | Wiles et al. |
| 2009/0294174 A1 | 12/2009 | Harmer et al. |
| 2009/0300535 A1 | 12/2009 | Skourup et al. |
| 2009/0319058 A1 | 12/2009 | Rovaglio et al. |
| 2009/0325603 A1 | 12/2009 | Van Os et al. |
| 2009/0327014 A1 | 12/2009 | Labedz et al. |
| 2010/0036779 A1 | 2/2010 | Sadeh-Koniecpol et al. |
| 2010/0069008 A1 | 3/2010 | Oshima et al. |
| 2010/0076642 A1 | 3/2010 | Hoffberg et al. |
| 2010/0082132 A1 | 4/2010 | Marruchella et al. |
| 2010/0082158 A1 | 4/2010 | Lakomiak et al. |
| 2010/0106282 A1 | 4/2010 | MacKelprang et al. |
| 2010/0127821 A1 | 5/2010 | Jones et al. |
| 2010/0127824 A1 | 5/2010 | Moschl et al. |
| 2010/0145476 A1 | 6/2010 | Junk et al. |
| 2010/0169785 A1 | 7/2010 | Jesudason |
| 2010/0185857 A1 | 7/2010 | Neitzel et al. |
| 2010/0190442 A1 | 7/2010 | Citrano, III et al. |
| 2010/0192122 A1 | 7/2010 | Esfahan et al. |
| 2010/0222899 A1 | 9/2010 | Blevins et al. |
| 2010/0262929 A1 | 10/2010 | Avery |
| 2010/0275135 A1 | 10/2010 | Dunton et al. |
| 2010/0286798 A1 | 11/2010 | Keyes et al. |
| 2010/0290351 A1 | 11/2010 | Toepke et al. |
| 2010/0290359 A1 | 11/2010 | Dewey et al. |
| 2010/0293019 A1 | 11/2010 | Keyes et al. |
| 2010/0293564 A1 | 11/2010 | Gould et al. |
| 2010/0305736 A1 | 12/2010 | Arduini |
| 2010/0318934 A1 | 12/2010 | Blevins et al. |
| 2011/0022193 A1 | 1/2011 | Panaitescu |
| 2011/0046754 A1 | 2/2011 | Bromley et al. |
| 2011/0071869 A1 | 3/2011 | O'Brien et al. |
| 2011/0072338 A1 | 3/2011 | Caldwell |
| 2011/0098918 A1 | 4/2011 | Siliski et al. |
| 2011/0115816 A1 | 5/2011 | Brackney |
| 2011/0130848 A1 | 6/2011 | Tegnell et al. |
| 2011/0140864 A1 | 6/2011 | Bucci |
| 2011/0144777 A1 | 6/2011 | Firkins et al. |
| 2011/0191277 A1 | 8/2011 | Ag ndez Dominguez et al. |
| 2011/0238189 A1 | 9/2011 | Butera et al. |
| 2011/0258138 A1 | 10/2011 | Kulkarni et al. |
| 2011/0276896 A1 | 11/2011 | Zambetti et al. |
| 2011/0276908 A1 | 11/2011 | O'Riordan |
| 2011/0279323 A1 | 11/2011 | Hung et al. |
| 2011/0282793 A1 | 11/2011 | Mercuri et al. |
| 2011/0295722 A1 | 12/2011 | Reisman |
| 2012/0004743 A1 | 1/2012 | Anne et al. |
| 2012/0005270 A1 | 1/2012 | Harding et al. |
| 2012/0010758 A1 | 1/2012 | Francino et al. |
| 2012/0011180 A1 | 1/2012 | Kavaklioglu |
| 2012/0011511 A1 | 1/2012 | Horvitz et al. |
| 2012/0029661 A1 | 2/2012 | Jones et al. |
| 2012/0038458 A1 | 2/2012 | Toepke et al. |
| 2012/0040698 A1 | 2/2012 | Ferguson et al. |
| 2012/0078869 A1 | 3/2012 | Bellville et al. |

(56) References Cited

U.S. PATENT DOCUMENTS

| | | |
|---|---|---|
| 2012/0095574 A1 | 4/2012 | Greenlee |
| 2012/0147862 A1 | 6/2012 | Poojary et al. |
| 2012/0163521 A1 | 6/2012 | Kirrmann et al. |
| 2012/0176491 A1 | 7/2012 | Garin et al. |
| 2012/0203728 A1 | 8/2012 | Levine |
| 2012/0226985 A1 | 9/2012 | Chervets et al. |
| 2012/0230309 A1 | 9/2012 | Junk |
| 2012/0239164 A1 | 9/2012 | Smith et al. |
| 2012/0249588 A1 | 10/2012 | Tison et al. |
| 2012/0259436 A1 | 10/2012 | Resurreccion et al. |
| 2012/0271962 A1 | 10/2012 | Ivanov et al. |
| 2012/0290795 A1 | 11/2012 | Dowlatkhah |
| 2012/0331541 A1 | 12/2012 | Hamilton, II et al. |
| 2013/0006696 A1 | 1/2013 | Louie et al. |
| 2013/0007223 A1 | 1/2013 | Luby et al. |
| 2013/0013523 A1 | 1/2013 | Herrera Campos |
| 2013/0029686 A1 | 1/2013 | Moshfeghi |
| 2013/0041479 A1 | 2/2013 | Zhang et al. |
| 2013/0060354 A1 | 3/2013 | Choi et al. |
| 2013/0086591 A1 | 4/2013 | Haven |
| 2013/0095849 A1 | 4/2013 | Pakzad |
| 2013/0120449 A1 | 5/2013 | Ihara et al. |
| 2013/0127980 A1 | 5/2013 | Haddick et al. |
| 2013/0144404 A1 | 6/2013 | Godwin et al. |
| 2013/0144405 A1 | 6/2013 | Lo |
| 2013/0144605 A1 | 6/2013 | Brager et al. |
| 2013/0151563 A1 | 6/2013 | Addepalli et al. |
| 2013/0159200 A1 | 6/2013 | Paul et al. |
| 2013/0169526 A1 | 7/2013 | Gai et al. |
| 2013/0184847 A1 | 7/2013 | Fruh et al. |
| 2013/0197954 A1 | 8/2013 | Yankelevich et al. |
| 2013/0211555 A1 | 8/2013 | Lawson et al. |
| 2013/0212129 A1 | 8/2013 | Lawson et al. |
| 2013/0214902 A1 | 8/2013 | Pineau et al. |
| 2013/0217417 A1 | 8/2013 | Mohideen et al. |
| 2013/0231947 A1 | 9/2013 | Shusterman |
| 2013/0257627 A1 | 10/2013 | Rafael |
| 2013/0265857 A1 | 10/2013 | Foulds et al. |
| 2013/0282150 A1 | 10/2013 | Panther et al. |
| 2013/0318536 A1 | 11/2013 | Fletcher et al. |
| 2014/0006338 A1 | 1/2014 | Watson et al. |
| 2014/0015672 A1 | 1/2014 | Ponce |
| 2014/0039648 A1 | 2/2014 | Boult et al. |
| 2014/0067800 A1 | 3/2014 | Sharma |
| 2014/0079297 A1 | 3/2014 | Tadayon et al. |
| 2014/0089504 A1 | 3/2014 | Scholz et al. |
| 2014/0108985 A1* | 4/2014 | Scott .................... G06F 3/0484 715/771 |
| 2014/0122806 A1 | 5/2014 | Lin et al. |
| 2014/0123276 A1 | 5/2014 | Bush et al. |
| 2014/0129002 A1* | 5/2014 | Brandes ............. G05B 19/0426 700/83 |
| 2014/0136652 A1 | 5/2014 | Narayanaswami et al. |
| 2014/0156032 A1 | 6/2014 | Jenkins et al. |
| 2014/0164603 A1 | 6/2014 | Castel et al. |
| 2014/0172961 A1 | 6/2014 | Clemmer et al. |
| 2014/0180671 A1 | 6/2014 | Osipova |
| 2014/0180970 A1 | 6/2014 | Hettenkofer et al. |
| 2014/0189520 A1 | 7/2014 | Crepps et al. |
| 2014/0201244 A1 | 7/2014 | Zhou |
| 2014/0232843 A1 | 8/2014 | Campbell |
| 2014/0250153 A1 | 9/2014 | Nixon et al. |
| 2014/0267599 A1 | 9/2014 | Drouin et al. |
| 2014/0273847 A1 | 9/2014 | Nixon et al. |
| 2014/0274123 A1 | 9/2014 | Nixon et al. |
| 2014/0277593 A1 | 9/2014 | Nixon et al. |
| 2014/0277594 A1 | 9/2014 | Nixon et al. |
| 2014/0277595 A1 | 9/2014 | Nixon et al. |
| 2014/0277596 A1 | 9/2014 | Nixon et al. |
| 2014/0277604 A1 | 9/2014 | Nixon et al. |
| 2014/0277605 A1 | 9/2014 | Nixon et al. |
| 2014/0277607 A1 | 9/2014 | Nixon et al. |
| 2014/0277615 A1 | 9/2014 | Nixon et al. |
| 2014/0277616 A1 | 9/2014 | Nixon et al. |
| 2014/0277617 A1 | 9/2014 | Nixon et al. |
| 2014/0277618 A1 | 9/2014 | Nixon et al. |
| 2014/0277656 A1 | 9/2014 | Nixon et al. |
| 2014/0278312 A1 | 9/2014 | Nixon et al. |
| 2014/0280497 A1 | 9/2014 | Nixon et al. |
| 2014/0280678 A1 | 9/2014 | Nixon et al. |
| 2014/0282015 A1 | 9/2014 | Nixon et al. |
| 2014/0282227 A1 | 9/2014 | Nixon et al. |
| 2014/0282257 A1 | 9/2014 | Nixon et al. |
| 2014/0297225 A1 | 10/2014 | Petroski et al. |
| 2014/0316579 A1 | 10/2014 | Taylor et al. |
| 2014/0358256 A1 | 12/2014 | Billi et al. |
| 2014/0359552 A1 | 12/2014 | Misra et al. |
| 2014/0372378 A1 | 12/2014 | Long et al. |
| 2014/0372561 A1 | 12/2014 | Hisano |
| 2014/0379296 A1 | 12/2014 | Nathan et al. |
| 2015/0024710 A1 | 1/2015 | Becker et al. |
| 2015/0067163 A1 | 3/2015 | Bahnsen et al. |
| 2015/0106578 A1 | 4/2015 | Warfield et al. |
| 2015/0172872 A1 | 6/2015 | Alsehly et al. |
| 2015/0177718 A1 | 6/2015 | Vartiainen et al. |
| 2015/0220080 A1 | 8/2015 | Nixon et al. |
| 2015/0222731 A1 | 8/2015 | Shinohara et al. |
| 2015/0246852 A1 | 9/2015 | Chen et al. |
| 2015/0261215 A1 | 9/2015 | Blevins et al. |
| 2015/0278397 A1 | 10/2015 | Hendrickson et al. |
| 2015/0296324 A1 | 10/2015 | Garaas et al. |
| 2015/0312721 A1 | 10/2015 | Singh et al. |
| 2015/0332188 A1 | 11/2015 | Yankelevich et al. |
| 2016/0098021 A1 | 4/2016 | Zornio et al. |
| 2016/0098037 A1 | 4/2016 | Zornio et al. |
| 2016/0098388 A1 | 4/2016 | Blevins et al. |
| 2016/0098647 A1 | 4/2016 | Nixon et al. |
| 2016/0132046 A1 | 5/2016 | Beoughter et al. |
| 2016/0261482 A1 | 9/2016 | Mixer et al. |
| 2016/0327942 A1 | 11/2016 | Nixon et al. |
| 2017/0102678 A1 | 4/2017 | Nixon et al. |
| 2017/0102693 A1 | 4/2017 | Kidd et al. |
| 2017/0102694 A1 | 4/2017 | Enver et al. |
| 2017/0102696 A1 | 4/2017 | Bell et al. |
| 2017/0103103 A1 | 4/2017 | Nixon et al. |
| 2017/0115648 A1 | 4/2017 | Nixon et al. |
| 2017/0154395 A1 | 6/2017 | Podgurny et al. |
| 2017/0199843 A1 | 7/2017 | Nixon et al. |
| 2017/0235298 A1 | 8/2017 | Nixon et al. |
| 2017/0236067 A1 | 8/2017 | Tjiong |
| 2018/0151037 A1 | 5/2018 | Morgenthau et al. |

FOREIGN PATENT DOCUMENTS

| | | |
|---|---|---|
| CN | 1409232 A | 4/2003 |
| CN | 1537258 A | 10/2004 |
| CN | 1589423 A | 3/2005 |
| CN | 1757002 A | 4/2006 |
| CN | 1804744 A | 7/2006 |
| CN | 1805040 A | 7/2006 |
| CN | 1826565 A | 8/2006 |
| CN | 1980194 A | 6/2007 |
| CN | 101097136 A | 1/2008 |
| CN | 101387882 A | 3/2009 |
| CN | 101449259 A | 6/2009 |
| CN | 201374004 Y | 12/2009 |
| CN | 101713985 A | 5/2010 |
| CN | 101788820 A | 7/2010 |
| CN | 101802736 A | 8/2010 |
| CN | 101828195 A | 9/2010 |
| CN | 101867566 A | 10/2010 |
| CN | 102063097 A | 5/2011 |
| CN | 102124432 A | 7/2011 |
| CN | 102169182 A | 8/2011 |
| CN | 102175174 A | 9/2011 |
| CN | 102184489 A | 9/2011 |
| CN | 102200993 A | 9/2011 |
| CN | 102213959 A | 10/2011 |
| CN | 102239452 A | 11/2011 |
| CN | 102243315 A | 11/2011 |
| CN | 102278987 A | 12/2011 |
| CN | 202101268 U | 1/2012 |
| CN | 102349031 A | 2/2012 |
| CN | 102375453 A | 3/2012 |

(56) References Cited

FOREIGN PATENT DOCUMENTS

| | | |
|---|---|---|
| CN | 102378989 A | 3/2012 |
| CN | 102402215 A | 4/2012 |
| CN | 102436205 A | 5/2012 |
| CN | 102494630 A | 6/2012 |
| CN | 102494683 A | 6/2012 |
| CN | 102637027 A | 8/2012 |
| CN | 102640156 A | 8/2012 |
| CN | 102707689 A | 10/2012 |
| CN | 102710861 A | 10/2012 |
| CN | 102867237 A | 1/2013 |
| CN | 103106188 A | 5/2013 |
| CN | 103403686 A | 11/2013 |
| CN | 103576638 A | 2/2014 |
| CN | 104035392 A | 9/2014 |
| CN | 104049575 A | 9/2014 |
| DE | 19882113 T1 | 1/2000 |
| DE | 19882117 T1 | 1/2000 |
| EP | 0 308 390 A1 | 3/1989 |
| EP | 0 335 957 A1 | 10/1989 |
| EP | 1 344 291 A1 | 9/2003 |
| EP | 1 414 215 A2 | 4/2004 |
| EP | 1 564 647 A2 | 8/2005 |
| EP | 1 912 376 A1 | 4/2008 |
| EP | 2 003 813 A1 | 12/2008 |
| EP | 2 112 614 A1 | 10/2009 |
| EP | 2 180 441 A1 | 4/2010 |
| EP | 2 469 475 A1 | 6/2012 |
| EP | 2 685 329 A1 | 1/2014 |
| EP | 2 704 401 A1 | 3/2014 |
| EP | 2 746 884 A1 | 6/2014 |
| EP | 2 801 939 A1 | 11/2014 |
| FR | 2 966 625 A1 | 4/2012 |
| GB | 2 336 977 B | 11/1999 |
| GB | 2 336 923 B | 6/2002 |
| GB | 2 403 028 A | 12/2004 |
| GB | 2 453 426 A | 4/2009 |
| GB | 2 512 984 A | 10/2014 |
| GB | 2 512 997 A | 10/2014 |
| GB | 2 532 849 A | 6/2016 |
| GB | 2 534 628 A | 8/2016 |
| GB | 2 537 457 A | 10/2016 |
| JP | 64-017105 A | 1/1989 |
| JP | 01-291303 A | 11/1989 |
| JP | 05-073131 A | 3/1993 |
| JP | 05-142033 A | 6/1993 |
| JP | 05-187973 A | 7/1993 |
| JP | 06-052145 A | 2/1994 |
| JP | 08-234951 | 9/1996 |
| JP | 09-330861 A | 12/1997 |
| JP | 10-116113 A | 5/1998 |
| JP | 10-326111 A | 12/1998 |
| JP | 11-327628 A | 11/1999 |
| JP | 2000-214914 A | 8/2000 |
| JP | 2001-512593 A | 8/2001 |
| JP | 2001-265821 A | 9/2001 |
| JP | 2002-010489 A | 1/2002 |
| JP | 2002-024423 A | 1/2002 |
| JP | 2002-099325 A | 4/2002 |
| JP | 2003-295944 A | 10/2003 |
| JP | 2004-102765 A | 4/2004 |
| JP | 2004-171127 A | 6/2004 |
| JP | 2004-199624 A | 7/2004 |
| JP | 2004-227561 A | 8/2004 |
| JP | 2005-107758 A | 4/2005 |
| JP | 2005-216137 A | 8/2005 |
| JP | 2005-242830 A | 9/2005 |
| JP | 2005-332093 A | 12/2005 |
| JP | 2006-172462 A | 6/2006 |
| JP | 2006-221376 A | 8/2006 |
| JP | 2006-527426 A | 11/2006 |
| JP | 2007-137563 A | 6/2007 |
| JP | 2007-148938 A | 6/2007 |
| JP | 2007-207065 A | 8/2007 |
| JP | 2007-242000 A | 9/2007 |
| JP | 2007-286798 A | 11/2007 |
| JP | 2007-536631 A | 12/2007 |
| JP | 2007-536648 A | 12/2007 |
| JP | 2008-065821 A | 3/2008 |
| JP | 2008-158971 A | 7/2008 |
| JP | 2008-305419 A | 12/2008 |
| JP | 2009-064451 A | 3/2009 |
| JP | 2009-140380 A | 6/2009 |
| JP | 2009-211522 A | 9/2009 |
| JP | 2009-251777 A | 10/2009 |
| JP | 2010-527486 A | 8/2010 |
| JP | 2011-022920 A | 2/2011 |
| JP | 2011-034564 A | 2/2011 |
| JP | 2011-204237 A | 10/2011 |
| JP | 2011-204238 A | 10/2011 |
| JP | 2012-048762 A | 3/2012 |
| JP | 2012-069118 A | 4/2012 |
| JP | 2012-084162 A | 4/2012 |
| JP | 4-934482 B2 | 5/2012 |
| JP | 2012-215547 A | 11/2012 |
| JP | 2012-527059 A | 11/2012 |
| JP | 2014-116027 A | 6/2014 |
| WO | WO-02/50971 | 6/2002 |
| WO | WO-03/073688 A1 | 9/2003 |
| WO | WO-2003/073688 A1 | 9/2003 |
| WO | WO-2005/083533 A1 | 9/2005 |
| WO | WO-2005/109123 A1 | 11/2005 |
| WO | WO-2008/042786 A2 | 4/2008 |
| WO | WO-2009/021900 A1 | 2/2009 |
| WO | WO-2009/046095 A1 | 4/2009 |
| WO | WO-2011/120625 A1 | 10/2011 |
| WO | WO-2012/016012 A2 | 2/2012 |
| WO | WO-2012/022381 A1 | 2/2012 |
| WO | WO-2012/096877 A1 | 7/2012 |
| WO | WO-2014/005073 A1 | 1/2014 |
| WO | WO-2014/145801 A2 | 9/2014 |
| WO | WO-2015/138706 A1 | 9/2015 |
| WO | WO-2016/057365 A1 | 4/2016 |

OTHER PUBLICATIONS

U.S. Appl. No. 13/784,041, entitled "Big Data in Process Control Systems", filed Mar. 7, 2013.
Hu et al., "Toward Scalable Systems for Big Data Analytics: A Technology Tutorial," IEEE, 2:652-687 (2014).
Lee et al., "Recent Advances and Trends in Predictive Manufacturing Systems in Big Data Environment," Manufacturing Letters, 1(1):38-41 (2013).
Mandavi et al., "Development of a Simulation-Based Decision Support System for Controlling Stochastic Flexible Job Shop Manufacturing Systems," Simulation Modeling Practice and Theory, 18:768-786 (2010).
Mezmaz et al., "A Parallel Bi-Objective Hybrid Metaheuristic for Energy-Aware Scheduling for Cloud Computing Systems," Journal of Parallel and Distributed Computing, Elsevier (2011).
Notification of First Office Action for Chinese Application No. 201480014734.3, dated Apr. 19, 2017.
Razik et al., "The Remote Surveillance Device in Monitoring and Diagnosis of Induction Motor by Using a PDA," IEEE (2007).
Search Report for Application No. GB1617019.3, dated Feb. 27, 2017.
Siltanen et al., "Augmented Reality for Plant Lifecycle Management," IEEE (2007).
Xu, "From Cloud Computing to Cloud Manufacturing," Robotics and Computer-Integrated Manufacturing 28:75-86 (2012).
Dongargaonkar et al., "PLC Based Ignition System," Conference Records of the 1999 IEEE Industry Application Conference, 1380-1387 (1999).
International Preliminary Report on Patentability for Application No. PCT/US2015/020148, dated Sep. 14, 2016.
"ANSI/ISA-S5.4-1991 American National Standard Instrument Loop Diagrams" by Instrument Societ of America, 1986, 22 pages.
"IoT and Big Data Combine Forces," (2013). Retrieved from the Internet at: URL:http://wiki.advantech.com/images/7/73/iot2013_whitepaper.pdf.

(56) References Cited

OTHER PUBLICATIONS

Bassat et al., "Workflow Management Combined with Diagnostic and Repair Expert System Tools for Maintenance Operations," IEEE, pp. 367-375 (1993).
Bryner, "Smart Manufacturing: the Next Revolution," Chemical Engineering Process (2012). Retrieved from the Internet at: URL:http://www.aiche.org/sites/default/files/cep/20121004a.pdf.
Building Smarter Manufacturing with the Internet of Things (IoT), (2014). Retrieved from the Internet at: URL:http://www.cisco.com/web/solutions/trends/iot/iot_in_manufacturing_1anuary.pdf.
Communication Relating to the Results of the Partial International Search, dated Jul. 11, 2014.
Examination Report for Application No. EP 14724871.0, dated Aug. 17, 2016.
Examination Report for Application No. GB1017192.4, dated May 28, 2014.
Examination Report for Application No. GB1017192.4, dated Sep. 5, 2013.
First Office Action for Chinese Application No. 201010589029.X, dated Dec. 10, 2013.
International Search Report and Written Opinion for Application No. PCT/US2014/030627, dated Sep. 11, 2014.
International Search Report and Written Opinion for Application No. PCT/US2015,053931, dated Jan. 26, 2016.
International Search Report and Written Opinion for Application No. PCT/US2015/020148, dated Jun. 18, 2015.
Krumeich et al., "Big Data Analytics for Predictive Manufacturing Control—A Case Study from Process Industry," IEEE International Congress on Big Data, pp. 530-537 (2014).
Notice of Reasons for Rejection for Japanese Application No. 2010-229513, dated Jul. 29, 2014.
Search Report for Application No. GB1017192.4, dated Feb. 15, 2011.
Search Report for Application No. GB1402311.3, dated Aug. 6, 2014.
Search Report for Application No. GB1403251.0, dated Aug. 8, 2014.
Search Report for Application No. GB1403407.8, dated Aug. 8, 2014.
Search Report for Application No. GB1403408.6, dated Aug. 8, 2014.
Search Report for Application No. GB1403471.4, dated Sep. 9, 2014.
Search Report for Application No. GB1403472.2, dated Aug. 22, 2014.
Search Report for Application No. GB1403474.8, dated Aug. 26, 2014.
Search Report for Application No. GB1403475.5, dated Sep. 3, 2014.
Search Report for Application No. GB1403476.3, dated Aug. 27, 2014.
Search Report for Application No. GB1403477.1, dated Aug. 28, 2014.
Search Report for Application No. GB1403478.9, dated Aug. 21, 2014.
Search Report for Application No. GB1403480.5, dated Aug. 28, 2014.
Search Report for Application No. GB1403615.6, dated Aug. 18, 2014.
Search Report for Application No. GB1403616.4, dated Sep. 1, 2014.
Search Report for Application No. GB1501042.4, dated Feb. 2, 2016.
Search Report for Application No. GB1513617.9, dated Jan. 21, 2016.
Search Report for Application No. GB1517034.3, dated May 26, 2016.
Search Report for Application No. GB1517038.4, dated Mar. 22, 2016.
Smalley, "GE Invests in Project to Embed Predictive Analytics in Industrial Internet," (2013). Retrieved from the Internet at: URL:http://data-informed.com/ge-invents-in-project-to-embed-predictive-analytics-in-industrial-internet/.
U.S. Appl. No. 14/028,785, filed Sep. 17, 2013.
U.S. Appl. No. 14/028,897, filed Sep. 17, 2013.
U.S. Appl. No. 14/028,913, filed Sep. 17, 2013.
U.S. Appl. No. 14/028,921, filed Sep. 17, 2013.
U.S. Appl. No. 14/028,923, filed Sep. 17, 2013.
U.S. Appl. No. 14/028,964, filed Sep. 17, 2013.
U.S. Appl. No. 14/174,413, filed Feb. 6, 2014, "Collecting and Delivering Data to a Big Data Machine in a Process Control System".
U.S. Appl. No. 14/212,411, filed Mar. 14, 2014, "Determining Associations and Alignments of Process Elements and Measurements in a Process".
U.S. Appl. No. 14/212,493, filed Mar. 14, 2014, "Distributed Big Data in a Process Control System".
U.S. Appl. No. 14/506,863, filed Oct. 6, 2014, "Streaming Data for Analytics in Process Control Systems".
U.S. Appl. No. 14/507,252, filed Oct. 6, 2014, "Automatic Signal Processing-Based Learning in a Process Plant".
U.S. Appl. No. 62/060,408, filed Oct. 6, 2014, "Data Pipeline for Process Control System Analytics".
U.S. Office Action for U.S. Appl. No. 13/784,041, dated Apr. 6, 2015.
U.S. Office Action for U.S. Appl. No. 13/784,041, dated Feb. 26, 2016.
U.S. Office Action for U.S. Appl. No. 13/784,041, dated Oct. 15, 2015.
U.S. Office Action for U.S. Appl. No. 14/216,823, dated Dec. 16, 2016.
Extended European Search Report for Application No. 17157505.3, dated Jun. 30, 2017.
"Control Loop Foundation—Batch and Continuous Processes", by Terrence Blevins and Mark Nixon, International Society of Automation, 2011, Chapter 7.
Adrian et al., "Model Predictive Control of Integrated Unit Operations Control of a Divided Wall Column," Chemical Engineering and Processing: Process Information, 43(3):347-355 (2004).
Aouada et al., "Source Detection and Separation in Power Plant Process Monitoring: Application of the Bootstrap," IEEE International Conference on Acoustics Speech and Signal Processing Proceedings (2006).
Bruzzone et al., "Different Modeling and Simulation Approaches Applied to Industrial Process Plants," Proceedings of the Emerging M&S Applications in Industry & Academia/Modeling and Humanities Symposium (2013).
Daniel et al., "Conceptual Design of Reactive Dividing Wall Columns," Symposium Series No. 152, pp. 364-372 (2006).
Dejanovic et al., "Conceptual Design and Comparison of Four-Products Dividing Wall Columns for Separation of a Multicomponent Aromatics Mixture," Distillation Absorption, pp. 85-90 (2010).
First Office Action for Chinese Application No. 201410088828.7, dated Aug. 1, 2017.
First Office Action for Chinese Application No. 201410097623.5, dated Sep. 26, 2017.
First Office Action for Chinese Application No. 201410097675.2, dated May 10, 2017.
First Office Action for Chinese Application No. 201410097873.9, dated Aug. 9, 2017.
First Office Action for Chinese Application No. 201410097874.3, dated Aug. 18, 2017.
First Office Action for Chinese Application No. 201410097875.8, dated Jul. 7, 2017.
First Office Action for Chinese Application No. 201410097921.4, dated Oct. 10, 2017.
First Office Action for Chinese Application No. 201410097922.9, dated Aug. 18, 2017.
First Office Action for Chinese Application No. 201410097923.3, dated Aug. 28, 2017.
First Office Action for Chinese Application No. 201410098326.2, dated Jul. 27, 2017.

(56) References Cited

OTHER PUBLICATIONS

First Office Action for Chinese Application No. 201410098327.7, dated Jul. 26, 2017.
First Office Action for Chinese Application No. 201410098982.2, dated Aug. 9, 2017.
First Office Action for Chinese Application No. 201410099103.8, dated Aug. 9, 2017.
Hiller et al., "Multi Objective Optimisation for an Economical Dividing Wall col. Design," Distillation Absorption, pp. 67-72 (2010).
International Preliminary Report on Patentability for Application No. PCT/US2014/030627, dated Sep. 15, 2015.
International Preliminary Report on Patentability for Application No. PCT/US2015/053931, dated Apr. 11, 2017.
Kiss et al., "A control Perspective on Process Intensification in Dividing-Wall Columns," Chemical Engineering and Processing: Process Intensification, 50:281-292 (2011).
Pendergast et al., "Consider Dividing Wall Columns," Chemical Processing (2008). Retrieved from the Internet at: <URL:http://www.chemicalprocessing.com/articles/2008/245/?show=all>.
Sailer et al., "Attestation-Based Policy Enforcement for Remote Access," Proceedings of the 11th ACM Conference on Computer and Communications Security (2004).
Sander et al., "Methyl Acetate Hydrolysis in a Reactive Divided Wall Column," Symposium Series No. 152, pp. 353-363 (2006).
Schultz et al., "Reduce Costs with Dividing-Wall Columns," Reactions and Separations, pp. 64-71 (2002).
Search Report for Application No. GB1617020.1, dated Apr. 13, 2017.
Search Report for Application No. GB1617021.9, dated Apr. 5, 2017.
Search Report for Application No. GB1617022.7, dated Apr. 18, 2017.
Search Report for Application No. GB1617023.5, dated Apr. 7, 2017.
Search Report for Application No. GB16702014.0, dated Aug. 3, 2017.
Shah et al., "Multicomponent Distillation Configurations with Large Energy Savings," Distillation Absorption, pp. 61-66 (2010).
Sunindyo et al., "An Event-Based Empirical Process Analysis Framework," ESEM (2010).
Thotla et al., "Cyclohexanol Production from Cyclohexene in a Reactive Divided Wall Column: A Feasibility Study," Distillation Absorption, pp. 319-324 (2010).
Tututi-Avila et al., "Analysis of Multi-Loop Control Structures of Dividing-Wall Distillation Columns Using a Fundamental Model," Processes, 2:180-199 (2014).
Final Rejection for Japanese Application No. 2014-048410, dated May 29, 2018.
First Office Action for Chinese Application No. 201410080524.6, dated Sep. 13, 2017.
First Office Action for Chinese Application No. 201410097872.4, dated Aug. 23, 2017.
First Office Action for Chinese Application No. 201510049715.0, dated May 4, 2018.
Notice of Reasons for Rejection for Japanese Application No. 2014-041785, dated Dec. 5, 2017.
Notice of Reasons for Rejection for Japanese Application No. 2014-041785, dated Nov. 30, 2017.
Notice of Reasons for Rejection for Japanese Application No. 2014-048410, dated Dec. 29, 2017.
Notice of Reasons for Rejection for Japanese Application No. 2014-048411, dated Dec. 5, 2017.
Notice of Reasons for Rejection for Japanese Application No. 2014-048412, dated Feb. 27, 2018.
Notice of Reasons for Rejection for Japanese Application No. 2014-049915, dated Mar. 13, 2018.
Notice of Reasons for Rejection for Japanese Application No. 2014-049916, dated Feb. 27, 2018.
Notice of Reasons for Rejection for Japanese Application No. 2014-049917, dated Mar. 6, 2018.
Notice of Reasons for Rejection for Japanese Application No. 2014-049918, dated Apr. 10, 2018.
Notice of Reasons for Rejection for Japanese Application No. 2014-049918, dated Dec. 12, 2017.
Notice of Reasons for Rejection for Japanese Application No. 2014-049919, dated Nov. 29, 2017.
Notice of Reasons for Rejection for Japanese Application No. 2014-049920, dated Feb. 20, 2018.
Notice of Reasons for Rejection for Japanese Application No. 2014-051114, dated Dec. 28, 2017.
Notice of Reasons for Rejection for Japanese Application No. 2014-051595, dated Jan. 16, 2018.
Notice of Reasons for Rejection for Japanese Application No. 2014-051596, dated Jan. 16, 2018.
Notice of Reasons for Rejection for Japanese Application No. 2014-051597, dated Jan. 9, 2018.
Notice of Reasons for Rejection for Japanese Application No. 2014-051598, dated Mar. 13, 2018.
Notice of Reasons for Rejection for Japanese Application No. 2014-051599, dated Nov. 28, 2017.
Notice of Reasons for Rejection for Japanese Application No. 2016-503431, dated Apr. 3, 2018.
Notification of First Office Action for Chinese Application No. 201410099068.X, dated Sep. 15, 2017.
Second Office Action for Chinese Application No. 201410088828.7, dated Apr. 27, 2018.
Second Office Action for Chinese Application No. 201410097675.2, dated Feb. 11, 2018.
Second Office Action for Chinese Application No. 201410097873.9, dated May 15, 2018.
Second Office Action for Chinese Application No. 201410097875.8, dated Jun. 6, 2018.
Second Office Action for Chinese Application No. 201410097922.9, dated Jan. 9, 2018.
Second Office Action for Chinese Application No. 201410098327.7, dated Feb. 27, 2018.
Examination Report for Application No. GB1402311.3, dated Sep. 28, 2018.
Notice of Reasons for Rejection for Japanese Application No. 2014-049916, dated Aug. 28, 2018.
Notice of Reasons for Rejection for Japanese Application No. 2014-051597, dated Jul. 31, 2018.
Decision of Refusal for Japanese Application No. 2014-048410, dated May 29, 2018.
Decision of Rejection for Chinese Application No. 201410097675.2, dated Jul. 2, 2018.
Examination Report for Application No. Ep 14724871.0, dated Aug. 10, 2018.
First Office Action for Chinese Application No. 201510113223.3, dated Jul. 4, 2018.
First Office Action for Chinese Application No. 201580014241.4, dated Jun. 22, 2018.
Notice of Reasons for Rejection for Japanese Application No. 2014-048411, dated Jul. 31, 2018.
Notice of Reasons for Rejection for Japanese Application No. 2014-049919, dated Jul. 31, 2018.
Notice of Reasons for Rejection for Japanese Application No. 2014-049920, dated Jun. 5, 2018.
Notice of Reasons for Rejection for Japanese Application No. 2014-051595, dated May 29, 2018.
Notice of Reasons for Rejection for Japanese Application No. 2014-051596, dated May 29, 2018.
Second Office Action for Chinese Application No. 201410097623.5, dated Jun. 26, 2018.
Second Office Action for Chinese Application No. 201410097872.4 dated Jul. 12, 2018.
Second Office Action for Chinese Application No. 201410097921.4, dated Jul. 5, 2018.
Second Office Action for Chinese Application No. 201410098326.2, dated Jun. 19, 2018.

(56) References Cited

OTHER PUBLICATIONS

Second Office Action for Chinese Application No. 201410098982.2, dated Jun. 11, 2018.
Second Office Action for Chinese Application No. 201410099068.X, dated Jun. 14, 2018.
Second Office Action for Chinese Application No. 201410099103.8, dated Jun. 5, 2018.
Third Office Action for Chinese Application No. 201410097922.9, dated Aug. 3, 2018.
Notice of Reasons for Rejection for Japanese Application No. 2016-503431, dated Jan. 8, 2019.

\* cited by examiner

DATA MODELING STUDIO

RELATED APPLICATIONS

This application is a regular filed application that claims priority to and the benefit of the filing date of U.S. Provisional Patent Application Ser. No. 61/798,820, entitled "Data Modeling Studio" which was filed on Mar. 15, 2013, the entire disclosure of which is hereby expressly incorporated by reference herein. This application is also related to U.S. patent application Ser. No. 13/784,041, entitled "Big Data in Process Control Systems" and filed on Mar. 7, 2013, the entire disclosure of which is hereby expressly incorporated by reference herein.

TECHNICAL FIELD

The present patent relates generally to process plants and process control systems, and more particularly, to the use of a data modeling studio to create and execute data processing models in process plants and/or in process control systems and particularly in process control systems that implement big data architectures.

BACKGROUND

Distributed process control systems, like those used in chemical, petroleum or other process plants, typically include one or more process controllers communicatively coupled to one or more field devices via analog, digital or combined analog/digital buses, or via a wireless communication link or network. The field devices, which may be, for example, valves, valve positioners, switches and transmitters (e.g., temperature, pressure, level and flow rate sensors), are located within the process environment and generally perform physical or process control functions such as opening or closing valves, measuring process parameters, etc. to control one or more processes executing within the process plant or system. Smart field devices, such as the field devices conforming to the well-known Fieldbus protocol may also perform control calculations, alarming functions, and other control functions commonly implemented within a process controller. The process controllers, which are also typically located within the plant environment, receive signals indicative of process measurements made by the field devices and/or other information pertaining to the field devices and execute a controller application that runs, for example, different control modules which make process control decisions, generate control signals based on the received information and coordinate with the control modules or blocks being performed in the field devices, such as HART®, WirelessHART®, and FOUNDATION® Fieldbus field devices. The control modules in the controller send the control signals over the communication lines or links to the field devices to thereby control the operation of at least a portion of the process plant or system.

Information from the field devices and the controller is usually made available over a data highway to one or more other hardware devices, such as operator workstations, personal computers or computing devices, data historians, report generators, centralized databases, or other centralized administrative computing devices that are typically placed in control rooms or at other locations away from the harsher plant environment. Each of these hardware devices typically is centralized across the process plant or across a portion of the process plant. These hardware devices run applications that may, for example, enable an operator to perform functions with respect to controlling a process and/or operating the process plant, such as changing settings of the process control routines, modifying the operation of the control modules within the controllers or the field devices, viewing the current state of the process, viewing alarms generated by field devices and controllers, simulating the operation of the process for the purpose of training personnel or testing the process control software, keeping and updating a configuration database, etc. The data highway utilized by the hardware devices, controllers and field devices may include wired communication paths, wireless communication paths, or a combination of wired and wireless communication paths.

As an example, the DeltaV™ control system, sold by Emerson Process Management, includes multiple applications stored within and executed by different devices located at diverse places within a process plant. A configuration application, which resides in one or more workstations or computing devices, enables users to create or change process control modules and download these process control modules via a data highway to dedicated distributed controllers. Typically, these control modules are made up of communicatively interconnected function blocks, which are objects in an object oriented programming protocol that perform functions within the control scheme based on inputs thereto and that provide outputs to other function blocks within the control scheme. The configuration application may also allow a configuration designer to create or change operator interfaces which are used by a viewing application to display data to an operator and to enable the operator to change settings, such as set points, within the process control routines. Each dedicated controller and, in some cases, one or more field devices, stores and executes a respective controller application that runs the control modules assigned and downloaded thereto to implement actual process control functionality. The viewing applications, which may be executed on one or more operator workstations (or on one or more remote computing devices in communicative connection with the operator workstations and the data highway), receive data from the controller application via the data highway and display this data to process control system designers, operators, or users using the user interfaces, and may provide any of a number of different views, such as an operator's view, an engineer's view, a technician's view, etc. A data historian application is typically stored in and executed by a data historian device that collects and stores some or all of the data provided across the data highway while a configuration database application may run in a still further computer attached to the data highway to store the current process control routine configuration and data associated therewith. Alternatively, the configuration database may be located in the same workstation as the configuration application.

The architecture of currently known process control plants and process control systems is strongly influenced by limited controller and device memory, communications bandwidth and controller and device processor capability. For example, in currently known process control system architectures, the use of dynamic and static non-volatile memory in the controller is usually minimized or, at the least, managed carefully. As a result, during system configuration (e.g., a priori), a user typically must choose which data in the controller is to be archived or saved, the frequency at which it will be saved, and whether or not compression is used. Thereafter, the controller is configured accordingly with this limited set of data rules. Consequently, data which could be useful in troubleshooting and process analysis is often not archived, and if it is collected, the useful information may have been lost due to data compression.

Additionally, to minimize controller memory usage in currently known process control systems, selected data that is to be archived or saved (as indicated by the configuration of the controller) is reported to the workstation or computing device for storage at an appropriate data historian or data silo. The current techniques used to report the data poorly utilizes communication resources and induces excessive controller loading. Additionally, due to the time delays in communication and sampling at the historian or silo, the data collection and time stamping is often out of sync with the actual process.

Similarly, in batch process control systems, to minimize controller memory usage, batch recipes and snapshots of controller configuration typically remain stored at a centralized administrative computing device or location (e.g., at a data silo or historian), and are only transferred to a controller when needed. Such a strategy introduces significant burst loads in the controller and in communications between the workstation or centralized administrative computing device and the controller.

Furthermore, the capability and performance limitations of relational databases of currently known process control systems, combined with the previous high cost of disk storage, play a large part in structuring data retrieval and storage into independent entities or silos to meet the objectives of specific applications. For example, within some current systems, the archiving of process models, continuous historical data, and batch and event data are saved in three different application databases or silos of data. Each silo has a different interface to access the data stored therein.

Structuring data in this manner creates a barrier in the manner in which historized data is accessed and used. For example, the root cause of variations in product quality may be associated with or be determined by data stored in more than one of these data silos. However, because of the different file structures of the silos, it is not possible or at least it is not very easy to provide tools that allow this data to be quickly and easily accessed for analysis. Further, audit or synchronizing functions must be performed to ensure that data across different silos is consistent.

The limitations of currently known process plants and process control system discussed above and other limitations may undesirably manifest themselves in the collection of data for configuration or creation of data models, which may include any routine that models or estimates the operation of the process or that performs an analysis of some aspect of the process using collected process data or based on process data from a real or simulated process. Currently known systems require users to select the data they want and configure plant equipment to collect the desired data. If a user later determines that additional data is necessary, the user has to reconfigure the plant to collect the new data and operate the plant to collect the new data, a process that could take anywhere from a few weeks to a few months. Because users rarely know all of the data that may be needed to create a model for a process at the onset of creating the model, much less at the outset of configuring the plant, currently known systems often make complex process modeling inefficient or impractical within actual processes. Even if the plant is able to collect all of the necessary data, memory and bandwidth constraints of currently known systems usually require the collected data to be highly compressed, collected at a low frequency rate and/or to have shifted or incorrect time stamps. Accordingly, data often may be inaccurate, incomplete and unusable for making complex predictions and determinations about the operation of the plant.

"Big data" generally refers to a collection of one or more data sets that are so large or complex that traditional database management tools and/or data processing applications (e.g., relational databases and desktop statistic packages) are not able to manage the data sets within a tolerable amount of time. Typically, applications that use big data are transactional and end-user directed or focused. For example, web search engines, social media applications, marketing applications and retail applications may use and manipulate big data. Big data may be supported by a distributed database that allows the parallel processing capability of modern multi-process, multi-core servers to be fully utilized. There has been some recent developments towards incorporating big data or big data machines within a process control system for the purpose of archiving process control data at a level that has not been available in the past. However, there is currently no or only very limited ability to analyze or use this data, as collected from a process plant or a process, to perform comprehensive or systematic analysis of the plant operation, to be able to detect trends, perform predictive analysis, detect abnormalities within the plant operation, retune or reconfigure the plant to operate more economically, etc. In particular, users must still manually create and test data models or modeling routines to process the data in a particular manner, which is very time intensive and difficult to do.

SUMMARY

A data modeling studio provides a structured environment for graphically creating or programming data models, which, for example, may be configured to use or analyze data from a big data machine, for the purpose of performing more systematic or comprehensive diagnosis, prognosis, analysis, identifying relationships, etc., within a process plant. The data modeling studio includes a configuration routine or engine for generating user interface elements to facilitate graphical construction or programming of a data model and a runtime engine for executing models to perform analysis of or with respect to a process. The configuration engine may include an interface routine that generates user interface elements, a plurality of model templates stored in a memory that serve as the building blocks of the model, and a model compiler that converts the created model into a software format executable by the runtime engine. The runtime engine may include a data retrieval routine for retrieving data used in executing a model, and a model execution routine that runs or executes the executable models.

The interface routine may include instructions stored in memory that when, executed on a processor, generate a library region on a user display that displays groups of model templates available for use in creating a data model, and a canvas region that serves as the main presentation window for graphically creating data models. More particularly, the library region may display model templates, which are elements used to construct the model, in the form of data input indicator templates, data output indicator templates, mathematical or other functional operation or data processing templates, etc. Thus, the model templates are generic model elements stored in a memory that may indicate data sources for data collected from the plant, devices in the process plant, mathematical operations to be performed on the data from the plant, data receivers (e.g., devices, interfaces, etc.) that are to receive the output of the data models, etc. In some embodiments, the data to be used for a data model may be comprehensive, high fidelity data stored in a big data machine, defining any or all of the various parameters of a process plant implementing a big data architecture.

Generally, the user may use the configuration routine of the data modeling studio to graphically arrange the model templates within the canvas region (which provides the user with a presentation window graphically displaying the data model as it is being constructed), to graphically interconnect the model templates to define the manner in which the templates will communicate with each other when executed within the model, to configure the parameters of the templates, to select data sources as inputs into the data model, to select functions to be performed on that data and to select one or more manners in which outputs produced by the data model are to be presented to or used in the plant. For example, a user may select one or more model templates or indicators of model templates from the library, drag them to the canvas region and drop them there. The user may then graphically interconnect the various templates within the canvas region to define how the templates interact with each other, such as to pass data therebetween. The user may also modify or configure each template in various manners to make the template perform in a certain manner, or on certain data, to name the templates, etc. The model compiler may include a compiler routine stored in a memory to transform the graphical representation of the data model created by the user using the user interface routine into a compiled model in an executable format supported by the runtime engine. The data model may also be saved as a new template in memory and the compiled model may be saved as an executable model in memory. Thereafter, the data model may be run or executed by the runtime engine within the plant environment to analyze data from the plant, such as to analyze process plant data stored in the big data machine (or other database), to analyze real-time data from the plant, etc.

In some cases, the user may create a data model, run this model on historical data as stored within a big data machine (or other historical database) to see if the data model operates appropriately for its intended purpose. If not, the user may alter or change the data model by, for example, incorporating additional process parameters or process data within the data model, and may then rerun the altered model on the same set of historical data (or data from the same time period), to thereby test the altered model. When the data modeling studio is connected to a process plant that has a big data machine that collects all or most of the data generated or detected within the process, the data associated with the new parameters used in the altered model are immediately available in the big data historical database, as this data was collected as part of the big data architecture of the process. In this manner, a model creator can quickly or more easily design, test, change and retest models on historical data prior to placing these model into operation within an on-line environment of the plant, within a simulation environment of the plant, within a knowledge discovery environment of the plant, etc.

The user may thus use the configuration engine to graphically create and compile a model for determining characteristics of products created by the plant, detecting faults with plant equipment, detecting faults within the operation of the plant, analyzing the operation of the plant, modeling the operation of the plant, diagnosing a current problem within a plant, predicting potential future problems within the plant, identifying relationships within plant data and plant equipment, etc.

Generally speaking, the runtime engine executes one or more compiled data models to produce the desired outputs. The runtime engine may include a retrieval routine for retrieving data corresponding to the data input templates of a model from memory (such as from a big data machine) or from the plant itself, and may include a model execution routine that executes the executable model. More specifically, the processor may execute the retrieval routine to retrieve data from data sources corresponding to the graphical data input templates used in the model, from memory. In some embodiments, the retrieval routine may retrieve data from a big data appliance used to store data retrieved from one or more devices in a process control system, while the model execution routine includes instructions stored in a memory that execute a compiled model (created using the templates retrieved from the memory) to produce an output using the retrieved data. The model execution routine may execute a model created using the configuration engine or a pre-configured model included with the data modeling studio. In some embodiments, one or more devices in the plant may automatically execute the model execution routine to run the data models, while in some other embodiments a user may decide to execute the model execution routine to run a model. Furthermore, the model execution routine may execute a data model in an off-line environment that is isolated from the operation of the plant where the model may be run on historical data stored in a memory. The model execution routine may also run a model in an online environment, where the retrieval model may retrieve real time or near real time data streams from one or more devices in the plant and/or from a big data appliance, to produce an output to affect the operation of the plant. Furthermore, the processor may execute the model execution routine in the background (i.e. operated by a device in the process control system without user interaction) or in the foreground (with user interaction).

The data modeling studio as described herein provides a robust and efficient architecture for graphically creating and executing data models in a process plant environment, and is particularly useful in analyzing data stored in a big data machine. When the data modeling studio is implemented in a process plant utilizing a big data architecture that includes a big data appliance that collects and stores all (or almost all) process data and plant data collected, the data modeling studio enables the efficient creation, testing, and operation of models using that data. For example, the user may use the data modeling studio to graphically and iteratively create and edit data models without having to reconfigure the plant operation to collect additional data, which makes for a must faster model development environment. Moreover, in some cases, because all of the plant data is available in a big data machine, a model may be created to iterate or change itself in various manners to add new, more or different data within a modeling routine or to analyze new or different data as part of the modeling routine, testing itself and iteratively changing itself to develop a better or more accurate model that provides better or more accurate predictions, trend analysis, fault or abnormal situation detection, etc. In still another case, a user may create one or more data models which can be used in a knowledge discovery environment to analyze data within a big data machine to discover relationships, trends, etc. about that data and thus about the plant.

The figures depict embodiments of the present invention for purposes of illustration only. One skilled in the art will readily recognize from the following discussion that alternate embodiments of the structures and methods illustrated herein may be employed without departing from the principles of the invention described herein.

DETAILED DESCRIPTION

Figure 1:
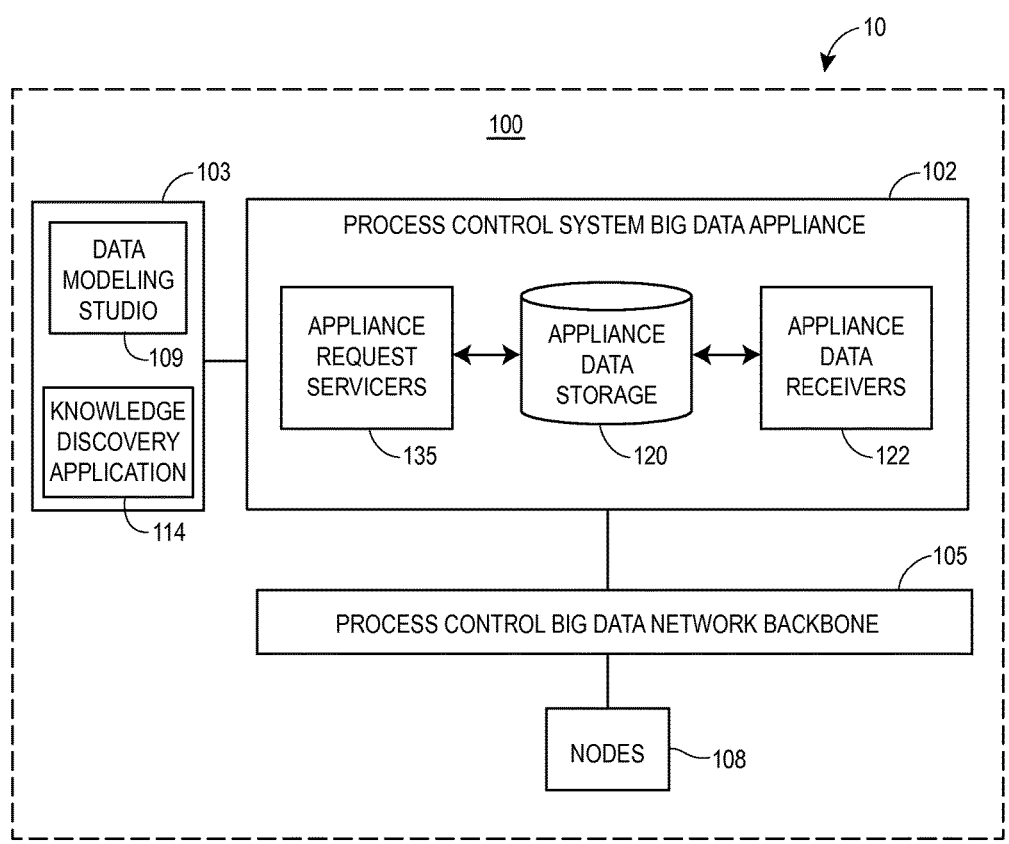
FIG. 1 is a block diagram of an example of a process plant or process control system that includes a big data machine that collects and stores data from a plant, and a data modeling studio that may be used to create and execute data models that use or analyze the data collected from the plant.

FIG. 1 is a block diagram of an example process control system 10 of a process plant that includes a big data network 100 which, in turn, collects data within a process plant. The process control system of FIG. 1 additionally includes a user interface station 103 provided within, for example, the process plant environment, that executes a data modeling studio 109 to enable a user to create and run various data models on the data collected by the big data network. The user interface station 103 also executes a data knowledge application 114, that executes models performing systematic or comprehensive diagnosis, prognosis, analysis, identifying relationships, etc., to discover and evaluate data retrieved from a process plant. Although FIG. 1 depicts that only a single user interface station 103 hosts the data modeling studio 109 and data knowledge application 114, in some embodiments, the data modeling studio 109 and data knowledge application 114 may be hosted on different user interface stations 103, multiple user interface stations 103 or be distributed among one or more devices in the process plant 109. More specifically, the data modeling studio 109 as implemented within the plant or process control system 10 provides a user or a model developer with a tool to assist in systematically and efficiently defining or creating data models (modeling routines) that run within the plant environment on historical data previously collected from the plant, real-time data currently collected within the plant, or both. The data modeling studio 109 and the data knowledge application 114 are able to take advantage of the fact that the big data network 100 collects, stores and provides efficient access to all or most of the data generated within or collected within the plant or process control system 10. Moreover, the data modeling studio 109 uses this data to provide the model developer with a more efficient manner of designing, testing and implementing models within the plant or process control system 10. The data knowledge application 114 provides an additional environment for implanting models with the plant or process control system 10, as well as viewing and exploring relationships between the data as well as the results of the executed model. As illustrated in FIG. 1, the data modeling studio 109 may be a set of instructions executed by one or more processors of one or more devices, such as on the user interface station 103. Of course, the data modeling studio 109 may be executed on any of a variety of computing devices, such tablets, mobile phones, laptop computers, desktop computers, servers, etc. and execute within one device or may be distributed among any number of such devices. Similarly, the data knowledge application 114 may be a set of instructions executed by one or more processors of one or more devices and executed on any of a variety of computing devices.

In a general sense, the example process control system big data network 100 includes a process control system big data apparatus or appliance 102, a process control system big data network backbone 105, and a plurality of nodes 108 that are communicatively connected to the backbone 105. The nodes 108 are additionally connected to process plant equipment like controllers, field devices, plant equipment, etc. Process-related data, plant-related data, communication related data and other types of data may be collected and cached at the plurality of nodes 108, and that data may be delivered, via the network backbone 105, to the process control system big data apparatus or appliance 102 for long-term storage (e.g., "historization") and processing. At least some of the data may be delivered between nodes 108 of the network 100, e.g., to control a process in real-time.

Any type of data related to the process control system 10 may be collected and stored at the process control system big data appliance 102. For example, real-time process data such as continuous, batch, measurement and event data that is generated while a process is being controlled in the process plant 10 (and, in some cases, that is indicative of an effect of a real-time execution of the process) may be collected and stored. Moreover, process definition, arrangement or set-up data, such as process plant configuration data and/or batch recipe data may be collected and stored. Additionally, data corresponding to the configuration, execution and results of process diagnostics may be collected and stored. Of course, other types of process data, such as alarms or alerts, may also be collected and stored. In a similar manner, data highway traffic and network management data of the backbone 105 and of various other communication networks of the process plant 10 may be collected and stored. Likewise, user-related data such as data related to user traffic, login attempts, queries and instructions may be collected and stored. Still further, text data (e.g., logs, operating procedures, manuals, etc.), spatial data (e.g., location-based data) and multi-media data (e.g., closed circuit TV, video clips, etc.) may be collected and stored.

The process control system big data network backbone 105 may include a plurality of networked computing devices, such as the user interface device 103 (hosting the data modeling studio 109 and the knowledge discovery application 114), or switches that are configured to route packets to/from various nodes 108 of the process control system big data network 100 and to/from the process control big data appliance 102 (which is itself a node of the process control system big data network 100). The plurality of networked computing devices of the backbone 105 may be interconnected by any number of wireless and/or wired links. Moreover, the process control system big data network backbone 105 may include one or more firewall devices.

By way of example, the big data network backbone 105 may support one or more suitable routing protocols, e.g., protocols included in the Internet Protocol (IP) suite (e.g., UPD (User Datagram Protocol), TCP (Transmission Control Protocol), Ethernet, etc.), or other suitable routing protocols. If desired, at least some of the nodes 108 may utilize a streaming protocol such as the Stream Control Transmission Protocol (SCTP) to stream cached data from the nodes 108 to the process control big data appliance 102 via the network backbone 105. Typically, each node 108 included in the process data big data network 100 may support at least an application layer (and, for some nodes, additional layers) of the routing protocol(s) supported by the backbone 105. Each node 108 may be uniquely identified within the process control system big data network 100, e.g., by a unique network address. Additionally, at least a portion of the process control system big data network 100 may be an ad-hoc network. As such, at least some of the nodes 108 may connect to the network backbone 105 (or to another node of the network 100) in an ad-hoc manner.

Moreover, data that is related to the process plant 10 (e.g., to physical equipment included in the process plant 10 such as machines and devices) but that may not be generated by applications that directly configure, control, or diagnose a process may also be collected and stored in the big data machine 102. For example, vibration data and steam trap data, plant safety data and data indicative of a value of a parameter corresponding to plant safety (e.g., corrosion data, gas detection data, etc.) may be stored. Likewise, data indicative of an event corresponding to plant safety may be collected and stored in the big data machine 102. Likewise, data corresponding to the health of machines, plant equipment and/or devices, equipment data (e.g., pump health data determined based on vibration data and other data), data corresponding to the configuration, execution and results of equipment, machine, and/or device diagnostics may be collected and stored.

In some cases, data generated by or transmitted to entities external to the process plant 10 may be collected and stored in the big data machine 102, such as data related to costs of raw materials, expected arrival times of parts or equipment, weather data, and other external data. Of course, all data that is generated, received, or observed by any of the nodes 108 that are communicatively connected to the network backbone 105 may be collected and caused to be stored at the process control system big data appliance 102.

As illustrated in FIG. 1, the process control system data modeling studio 109 may be configured to provide a primary interface into the process control system big data network 100 for configuration and data exploration, e.g., on a user interface or other interface device for use by a user or other applications. The process control system data modeling studio 109 may be connected to the big data appliance 102 via the process control system big data network backbone 105, or may be directly connected to the process control system big data appliance 102 or may be coupled to the big data appliance 102 in any other manner.

In the example process control system big data process control network 100 of FIG. 1, the process control big data apparatus or appliance 102 is centralized within the network 100, and is configured to receive data (e.g., via streaming and/or via some other protocol) from the nodes 108 of the network 100 and to store the received data. As such, the process control big data apparatus or appliance 102 may include a data storage area 120 for historizing or storing the data that is received from the nodes 108, a plurality of appliance data receivers 122 that may collect data for storage in the big data machine 102, and a plurality of appliance request servicers 135 that request and access data from the big data storage 120. In any event, it is useful if all or most of the data collected in the process control network and stored in the data storage area 120 is available to a user of the data modeling studio 109 and the knowledge discover application 114.

The process control system big data storage area 120 may include multiple physical data drives or storage entities, such as RAID (Redundant Array of Independent Disks) storage, cloud storage, or any other suitable data storage technology that is suitable for data bank or data center storage. However, to the nodes 108 of the network 100, the data storage area 120 has the appearance of a single or unitary logical data storage area or entity. As such, the data storage 120 may be viewed as a centralized big data storage area 120 for the process control big data network 100 or for the process plant 10. If desired, a single logical centralized data storage area 120 may service multiple process plants (e.g., the process plant 10 and another process plant). For example, a centralized data storage area 120 may service several refineries of an energy company. In addition, the centralized data storage area 120 may be directly connected to the backbone 105 via, for example, at least one high-bandwidth communication link. Moreover, the centralized data storage area 120 may include an integral firewall.

The structure of the unitary, logical data storage area 120 may support the storage of all or most process control system related data. For example, each entry, data point, or observation of the data storage entity may include an indication of the identity of the data (e.g., source, device, tag, location, etc.), a content of the data (e.g., measurement, value, etc.), and a time stamp indicating a time at which the data was collected, generated, received or observed. As such, these entries, data points, or observations are referred to herein as "time-series data." The data may be stored in the data storage area 120 using a common format including a schema that supports scalable storage, streamed data, and low-latency queries, for example.

In one case, the schema may include storing multiple observations in each row, and using a row-key with a custom hash to filter the data in the row. The hash may be based on the time stamp and a tag. For example, the hash may be a rounded value of the time stamp, and the tag may correspond to an event or an entity of or related to the process control system. Metadata corresponding to each row or to a group of rows may also be stored in the data storage area 120, either integrally with the time-series data or separately from the time-series data. For example, the metadata may be stored in a schema-less manner separately from the time-series data.

If desired, the schema used for storing data at the appliance data storage 120 may also be utilized for storing data in the cache of at least one of the nodes 108. Accordingly, in this case, the schema is maintained when data is transmitted from the local storage areas of the nodes 108 across the backbone 105 to the process control system big data appliance data storage 120.

In addition to the data storage 120, the process control system big data appliance 102 may further include one or more appliance data receivers 122, each of which is configured to receive data packets from the backbone 105, process the data packets to retrieve the substantive data and timestamp carried therein, and store the substantive data and timestamp in the data storage area 120. The appliance data receivers 122 may reside on a plurality of computing devices or switches, for example. Multiple appliance data receivers 122 (and/or multiple instances of at least one data receiver 122) may operate in parallel on multiple data packets.

In cases in which the received data packets include the schema utilized by the process control big data appliance data storage area 120, the appliance data receivers 122 merely populate additional entries or observations of the data storage area 120 with the schematic information (and, may optionally store corresponding metadata, if desired). In cases in which the received data packets do not include the schema utilized by the process control big data appliance data storage area 120, the appliance data receivers 122 may decode the packets and populate time-series data observations or data points of the process control big data appliance data storage area 120 (and, optionally corresponding metadata) accordingly.

Additionally, the process control system big data appliance 102 may include one or more appliance request servicers 135, each of which is configured to access time-series data and/or metadata stored in the process control system big data appliance storage 120, e.g., per the request of a requesting entity or application. The appliance request servicers 135 may reside on a plurality of computing devices or switches, for example. At least some of the appliance request servicers 135 and the appliance data receivers 122 may reside on the same computing device or devices (e.g., on an integral device), or may be included in an integral application.

In some cases, multiple appliance request servicers 135 (and/or multiple instances of at least one appliance request servicer 135) may operate in parallel on multiple requests from multiple requesting entities or applications. Of course, a single appliance request servicer 135 may service multiple requests, such as multiple requests from a single entity or application, or multiple requests from different instances of an application. In any event, the data modeling studio 109 and the knowledge discovery application 114 of FIG. 1 may access the data stored in the data storage area 120 via one or more request servicers 135.

Figure 2:
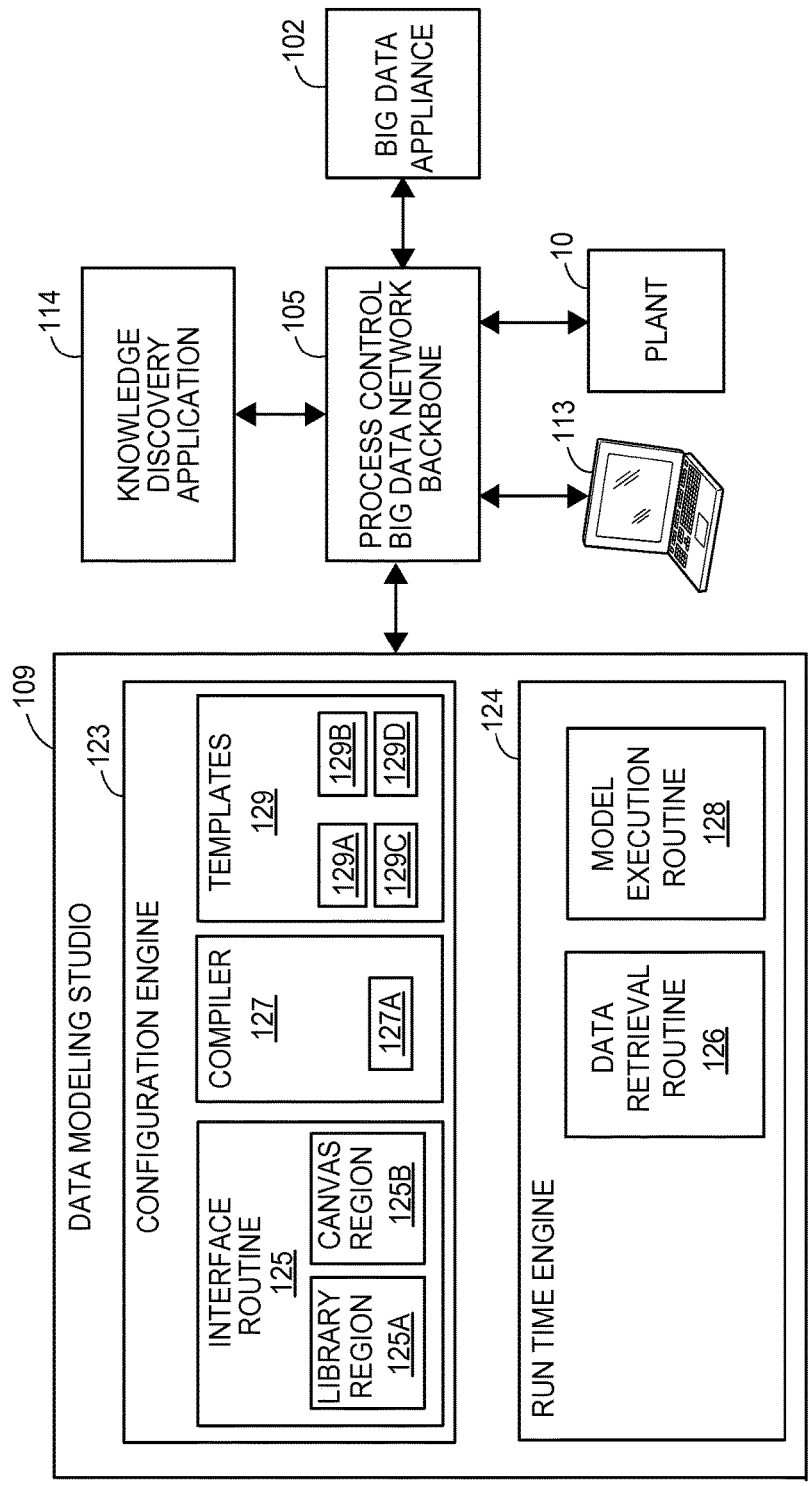
FIG. 2 is a block diagram of an example embodiment of the data modeling studio of FIG. 1 as connected within a generic plant environment.

FIG. 2 is a block diagram of an example embodiment of the data modeling studio 109 as coupled to the big data appliance 102 and the process plant 10 via the process control big data backbone 105 of FIG. 1. As further illustrated in FIG. 2, one more additional user interface devices 113 may access the data modeling studio 109 via the process control big data backbone 105. Additionally, the knowledge discovery application 114 is coupled to the process control big data backbone 105. Generally speaking, the data modeling studio 109 provides a structured environment for graphically creating and programming models configured to perform operations on data collected from the big data machine. In this context, a model is a mathematical routine performed on data to produce an output that gives some knowledge concerning the operation of a process plant (such as the process plant 10). The model is constructed of one or more data inputs, one or more functions that are performed on the data inputs and one or more outputs that are a result of the functions.

As illustrated in FIG. 2, the data modeling studio 109 includes a configuration engine 123 for generating a structured environment to facilitate graphical model creation and a run-time engine 124 for executing created models. More specifically, the configuration engine 123 includes an interface routine 125 to generate elements of a graphic user interface for the structured environment, a plurality of templates 129 that serve as the building blocks of the model and a model compiler 127 that converts the model into a data format executable by the run-time engine 124. The run time engine 124 includes a data retrieval routine 126 for retrieving data used in executing the model, and a model execution routine 128 for running the executable model.

The interface routine 125 includes a set of instructions stored in memory that when, executed by a processor, generates a set of user interface elements of a drag and drop graphical user interface to facilitate creation of the model including a library region 125a that displays the templates 129 and a canvas region 125b that serves as the main presentation window for creating models. The templates 129 serve as the building blocks of the model and can be selected and moved to the canvas region 125b to create the model. The templates 129 included in the configuration engine 123 of the data modeling studio 109 include data source templates 129a (that specify sources of data used in the model), function templates 129b (that specify routines performed on data represented by the data source templates 129a), output templates 129c (that specify how to present or send data produced by the model) and data flow templates 129d (that specify the inputs and outputs of the templates 129 that form the model).

The data source templates 129a indicate data sources that collect various data types (structured and/or unstructured), contexts and/or boundary conditions of data that is communicated, generated, received and/or observed within the process plant 10. The data source templates 129a may pertain to database data, streamed data, transactional data, and/or any other type of data that is communicated via the process control system big data network 100 and is stored or historized in process control system big data storage 120. The data source templates 129a may also include data sources stored in the big data appliance 102 that collects and stores all (or almost all) process data and plant data collected as part of the big data architecture of the process plant 10. The data sources 129a may define comprehensive, high fidelity data stored in the big data appliance 102, defining any or all of the various parameters of the process plant 10 implementing a big data architecture.

Example data source templates 129a include pressure readings, valve readings, temperature readings, vibration readings. The user may set parameters for the historical or real time data so that only a subset for the data is selected. For example, the data source templates 129a may indicate a data source that collects temperature data in degrees Celsius that are typically expected to be in the range of Temperature A to Temperature B. The data source templates 129a may also represent data sources external from the process plant 10, such as an external plant site or an external database, such as a weather or environment database.

The function templates 129b can be any basic or unitary functionality to be performed on data. For example, the function templates 129b may include mathematical functions such as neural network routine, a correlation routine, a threshold routine or a statistical processes such as an averaging routine, a maximum routine, a minimum routine, a filter routine, etc. The function templates 129b may also include classification techniques such as random forest algorithms or partial least square regressions. Still further, the function templates 129b may include data processing techniques for preparing data for analysis, such as a filtering routine that removes data higher than a certain threshold level or a clipping routine to remove outlier data. The user may also be able to alter one or more parameters of the function templates 129b. For example, the user may select a filter routine and define the characteristics of a low point filters (a particular slope), a clipping filter (a threshold level), etc.

The output templates 129c define how to interpret and/or present the result of the functionality performed on the data by the completed model. For example, if the output of a model is to be graphically presented to a user, an output template 129c may represent a graph, a chart or a display interface. The output template may further define one or more data massaging techniques to prepare the data for the graphical presentation specified by the output template. For example, a bar graph may require a numerical value rounded to two significant figures and the output template may also include a rounding routine to prepare the data. Output templates 129c may also indicate a particular location where the output of a model should be sent. For example, an output template 129c may indicate that a set of values produced by the model are to be sent to one or more controllers in a process plant (such as the process plant 10). Example values include a set point value, a control routine, etc. However, an output can be any value such as a binding representing a relationship, a specific value, a binary value indicating whether or not a data output meets a threshold, a percentage corresponding to a potency, etc.

The data flow templates 129d are used to specify the inputs and outputs of the templates 129. For example, a data flow template 129d may indicate that a certain data source template 129a is the input into a certain function template 129b in order to produce a certain output (which is graphically represented by an output template 129c).

However, the user is not limited to using pre-defined templates included in the data modeling studio 109. The user may edit existing templates, add new templates, and/or save the edited/new template to the data modeling studio 109 for future use. For example, if a pre-existing averaging routine (graphically represented by a function template 129b) accepts 2 data source inputs, a user may edit the averaging routine template to accept 3 inputs. The user may also create new templates from scratch to add additional functionality to the data modeling studio 109. The user may also save models or portions of models created with the data modeling studio as templates for future use.

The model compiler 127 may include a compiler routine 127a stored in memory that executes on a processor to transform the graphical model created using the user interface into a compiled model in an executable data format supported by the run time engine 124.

The run time engine 124, which executes the compiled model to produce a desired output (as defined by the model), includes a data retrieval routine 126 for retrieving data from the memory 120 and/or from the plant devices, and a model execution routine 128 for running and/or executing the executable models. More specifically, a processor may execute the retrieval routine 126 to retrieve data from data sources and functions, corresponding to the graphical templates 129 used in the model, from memory. In some embodiments, the retrieval routine 126 may retrieve data from a big data appliance 120 via the big data network backbone 105 and/or from the plant itself. The model execution routine 128 may include a set of instructions stored in memory that execute a compiled model on a processor to produce an output.

The model execution routine 128 may run a model in an off-line environment that is isolated from the operation of the plant where the model may be run on historical data stored in memory or may run a model in an online environment, where the retrieval routine 126 may retrieve real time or near real time data streams from one or more devices in the plant or big data appliance and produce an output, that may be provided to a user and/or that may be used to affect the operation of the plant.

As a more specific example, a data source template 129a (defining the data to be input into the model) may be connected to a first function template 129b defining filtering functionality (e.g., a low pass, a high pass, a smoothing filter, etc.) The filtering function template 129b can be connected to a second function template 129b defining a clipping routine, which can be connected to a third function template 129b defining a neural network technique which can then be connected to a fourth function template 129b defining another filtering technique which can be connected to a fifth function template 129b defining an averaging technique which can be connected to a sixth function template 129b defining a threshold detection routine which can be connected to a display template (e.g., an output template).

Figure 3:
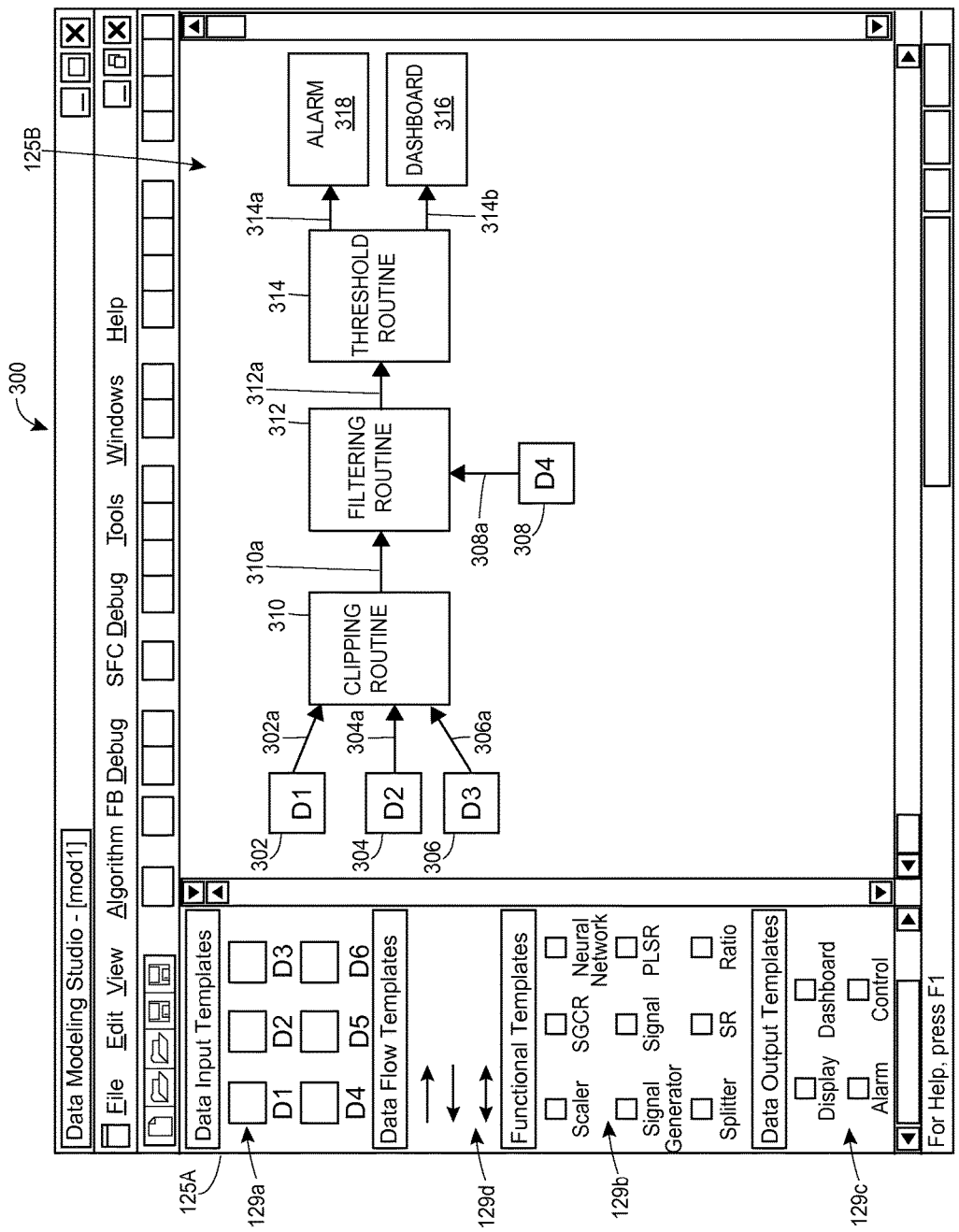
FIG. 3 is a screen presentation of a graphical user interface of the data modeling studio of FIGS. 1 and 2.

FIG. 3 illustrates an example graphical user interface 300 of the data modeling studio 109 for facilitating graphical creation of models. As discussed above, the interface routine 125 of the configuration engine 123 generates a drag and drop graphical user interface 300 including a library region 125a that displays the templates 129 and a canvas region 125b that serves as the main presentation window for creating models. As illustrated in FIG. 3, the library region 125a displays a plurality of templates 129, that serve as the graphical building blocks of the model. The templates 129 may include data sources templates 129a indicating data collected by devices in the process plant, function templates 129b graphically depicting basic or unitary functionality to be performed on data, output templates 129c defining an output of the model and data flow templates 129d representing data flow within the model, such as, inputs, bindings, interconnections and operations to be performed on the data, model data receivers that may receive the output.

A user may construct the model by selecting different templates 129 from the library region 125a and dragging them to the canvas region 125b. The user may arrange the templates 129 in the canvas region 126b and use the data flow templates 129d in order to simulate the data flow within the model. Although FIG. 3 illustrates a drag and drop graphical user interface, other embodiments of the data modeling studio 109 may include other graphical or non-graphical interfaces.

Figure 4:
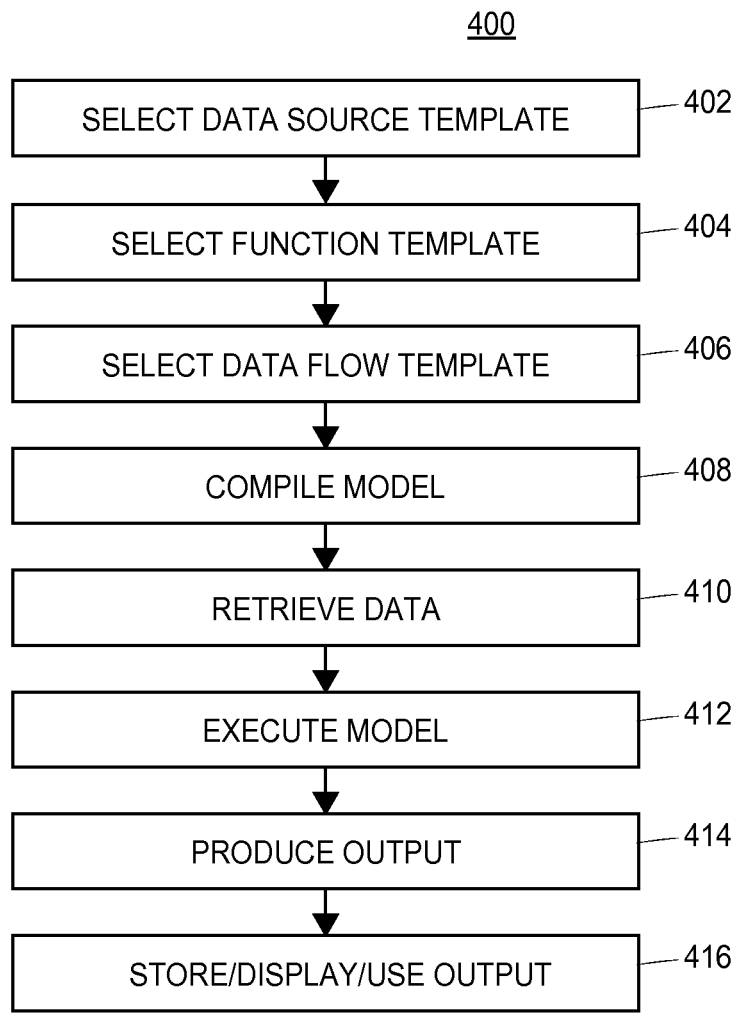
FIG. 4 is a flow diagram of an example method of creating a data model using the data modeling studio of FIGS. 1 and 2.

The configuration engine further enables a user to modify the data model templates 129a depicted in the canvas region 125b by defining specific parameters to be used in the templates 129 and the interconnections between data model templates, to create interconnected model blocks forming a data model. The data model may include, for example, a model input block defining a specific data source of data to be retrieved for the data model, one or more model functional blocks defining data processing procedures to be performed on the data from the specific data source and a model output block defining an operation associated with the output of the one or more functional blocks FIG. 4 illustrates a flow diagram of an example method 400 for using the graphic user interface 300 generated by the interface routine 125 to create a model in a process control environment. The method 400 may also be implemented in the process control system big data network 100 of FIG. 1. For illustrative (and non-limiting) purposes, the method 400 is discussed below with simultaneous reference to FIGS. 1-3.

At block 402, a first template may be selected from the library region 125a, such as a data source template 129a indicating a data source for data collected by devices in the process plant. A user can enter an input, such as a mouse click, keyboard press, voice command, touch screen press, etc. to select the first template. The user may drag the selected data source template 129a from the library region 125a to a desired location within the canvas region 129b. The data templates 129a may also have parameters and interconnections (defining the connections between the different templates 129 and parameters) that can be defined and changed. The data modeling studio may further modify the received data source template 129a and any specified parameters and/or interconnections to create a model input block defining a specific data source of data to be retrieved for the data model. Though the method 400 only depicts one data source template 129a for inclusion in the model, this is for illustration purposes only and one or more data source templates 129a may be included.

At block 404, a second template may be selected from the library region, such as a function template 129b. As described above, the function templates 129b are generic or predefined mathematical operations to be performed on the data provided thereto to produce outputs. The function templates 129b may have parameters (e.g., gains, filter settings, thresholds, etc.) and interconnections (defining the connections between the different templates 129 and parameters) that can be defined and changed. After selecting the function template 129b from the library region 125a, the user may drag the selected template to a desired location within the canvas region 125b. The user may also adjust one or more parameters of the function template 125b. The data modeling studio may further modify the received function template 129b and any specified parameters and/or interconnections to create a model functional block defining data processing procedures to be performed on the data from the specific data source. For example, if the function template 125b is a filter routine, the user may define characteristics or parameters of the filter to create a low point filter having a particular slope characteristic. Though the method 400 only depicts one function template 125b being selected, this is for illustration purposes only and one or more function template 125b may be included in the model.

At block 406, the user may select a third template, such as one or more data output templates 129c and/or one or more data flow templates 129d to add to the model. The data output templates 129c and data flow templates 129 may also have parameters and interconnections (defining the connections between the different templates 129 and parameters) that can be defined and changed. For example, the user may select an input template to graphically indicate that an output of a data source template 129a is an input into a particular a function template 129b. The user may select an output template to graphically indicate that the result of the function template 129b is to be graphically presented to a user through a dashboard view. The data modeling studio may further modify the received data output template 129c and/or data flow template 129d to create a model output block and/or a model data flow block, respectively, defining an operation associated with the output of the one or more functional blocks.

interconnected model blocks forming a data model. For example, the data model may include, one or more model functional blocks defining data processing procedures to be performed on the data from the specific data source and a model output block defining an operation associated with the output of the one or more functional blocks.

At block 408, the user may make an input selection to compile the model. Accordingly, the graphical model created using the configuration engine 123 is converted into a compiled model in a data format readable by the run time engine 124. Once compiled, the user may save the model and/or compiled model to memory. The compiled model may be retrieved by the user of the data modeling studio 109 at a later time and/or may be retrieved by a user of the knowledge exploration application 114.

At block 410, a retrieval routine 126 of the run-time engine 124 may retrieve data corresponding to the templates 129. For example, the retrieval routine 126 may retrieve data from the data sources indicated by the data source templates 129a and instructions corresponding to the function templates 129b from memory. For example, the retrieval routine 124 may retrieve data from the big data appliance 102 of the process control system big data network 100, e.g., by one or more data receivers 122. The data source templates 129a may correspond to process control data and process plant data. The data may include real-time data generated while controlling a process in the process plant, configuration data, batch data, network management and traffic data of various networks included in the process plant, data indicative of user or operator actions, data corresponding to the operation and status of equipment and devices included in the plant, data generated by or transmitted to entities external to the process plant, and other data. The data may also be retrieved from a third party database, such as a weather database or another process plant accessed through the big data backbone 105.

At block 412, the model may be executed by the model execution routine 128. The model execution routine 128 may run the model in an off-line environment that is isolated from the operation of the process plant where the model may be run on historical data stored in memory. The model execution routine 128 may also run the model in an online environment, where the data retrieval routine 126 may retrieve real time or near real time data streams from one or more devices in the plant or big data appliance.

At block 414, the model execution routine 128 may produce one or more outputs as a result of the operation of the model. In some embodiments, outputs may include one or more of a data relationship, a binding, a model, a parameter, a parameter value, etc. The model may also produce an output in the form of one or more potential actions for the user to incorporate into the process control system and/or process plant, for example, to adjust the temperature of a vat in order to ensure product quality. The model may produce an output in the form of a control routine or an adjustment to a control routine. The data modeling studio 109 may also present output in the form of an alert sent to one or more users. The alert may further be based on their role and responsibilities in the plant. For example, an operator responsible for the maintenance of a boiler may receive an alert related to the boiler. The alert may include the potential problem that the model discovered as well as one or more possible solutions or actions which the user may act on. The data modeling studio 109 may display the results of one or more applications. For example, the results may be displayed the results as a set of raw data points which can be used as the input into another data template or used as part of another data model.

At block 416, the output defined by the output template 129c of the model may be stored. For example, the output may be stored in the unitary, logical big data storage area. In some embodiment's the output may be a routine that may be uploaded to one or more devices in the processing plant. For example, the data modeling studio may output a control routine that may be transmitted to one or more controllers in the processing plant or transmitted to another processing plant through the big data backbone 105. Furthermore, the model may be stored in the big data appliance 102 for future use or access.

The output of the model may also be presented in a graphical manner such as a chart, graph, etc. One type of display which may be useful is to incorporate plant data with data items from other data sources, such as other plants, and/or third party databases such as weather database. In one embodiment, the data modeling studio 109 may generate a PHV chart and display event chronicle data as well as event data from non-plant data sources. Items from the other data sources may be placed on the chart in a time order just as the process plant events such as an alarms are placed. In some embodiments, these may also be live linked items that lead the user to the other data sources and/or other information displays and may allow exploration of these other data sources as well as modeling and analytics to allow the user to determined relationships between the plant and outside data. Additionally, the data modeling studio 109 may generate an information display based on one or more queries in the contact of the current issues. The current issues may be determined by a variety of techniques, such as a manual selection of current issue or based on a recent alarm.

The user may continue to select and arrange templates 129 and select one or more data flow templates 129*d* to represent connections between the templates 129. Turning again to FIG. 3, a user may graphically construct a model to determine if temperature readings from a variety of sensors meet a threshold level. As illustrated in FIG. 3, four data templates corresponding to sensors D1 (302), D2 (304) and D3 (306), D4 (308) are placed in the canvas region 125*b*. Furthermore, three function templates corresponding to a clipping routine 310, a filtering routine 312 and a threshold routine 314 are also placed in the canvas region 125*b*. The user has further selected data flow templates 302*a*, 304*a*, and 306*a* indicating that data sources D1 (302), D2 (304) and D3 (306), respectively, serve as inputs into the clipping routine function template 310. Data flow template 310*a* graphically indicates that the output of the clipping routine 310 is input the filtering routine function template 312. Data flow template 308*a* graphically indicates that data source D4 (308) is also input the filtering routine function template 312. Data flow template 312*a* indicates that the output of the filtering routine 312 is input into a function template corresponding to the threshold routine 314. In this example, the threshold routine 314 may take the data from the filtering routine 312 and determine if any values meet a threshold value using the threshold routine 314. Data flow indicator 314*a* indicates that the output of the threshold routine 314 (which may be, for example, a binary value indicating whether or not the threshold was met) is output to a dashboard view, graphically represented in the model by dashboard template 316. Additionally, data flow indicator 314*b* indicates that the output of the threshold routine is also output to an alarm, graphically represented in the model by alarm template 318. The alarm template 318 may be set to alert a user (either graphically, audibly, etc.) that the threshold is not met.

In some embodiments, the user may select one or more data flow templates 129*d* to represent an input into the function templates 129*b*. The user may select the output of a first function template 129*b* to serve as the inputs of a second function template 129*b*. For example, the user may select two data source templates 129*a* as inputs into a modeling structure routine, to model the operation of the plant using the data sources. The user may select the output of this model as the input into a function template 129*b* defining an analysis routine, such as a regression analysis. In some embodiments, the user may wish to "bind" two data templates 129*a* together to indicate a relationship. For example, a user may use the interface to bind the temperature output of a vat to an alarm associated with a particular controller in a process plant, such as the process plant 10.

The user may also create a model to simulate the operation of the process plant 10 and set an output template 129*d* to include one or more predictions affecting operation of the quality of one or more products manufactured by the process plant 10. By executing the simulation model, the user does not have to wait until after the process plant 10 has finished manufacturing a product to test the characteristics of a product. For example, a processing plant producing a vaccine can model the operation of the process plant 10 based on real time data and perform analysis and/or modeling on real time or near real time data and historical data to predict the potency of the vaccine. A model graphically created using the data modeling studio 109 may predict the potency of the virus based on the current plant conditions and process control readings and compare them to historical reasons to determine the potency of a vaccine or to adjust the operation of the process plant 10, for example adjusting the temperature of a vat.

A user of the data modeling studio 109, however, is not just limited to creating models that model the operation of a process plant but may be used to perform analysis on the plant equipment itself. The data source templates 129*a* may also include data sources stored in the big data appliance 102 that collects and stores all (or almost all) process data and plant data collected as part of the big data architecture of the process plant 10. The data sources 129*a* may define comprehensive, high fidelity data stored in the big data appliance 102, defining any or all of the various parameters of the process plant 10 implementing a big data architecture. Because the data modeling studio 109 provides access to a variety of data source templates 129*a* that indicate data sources that retrieve data from the entirety of the plant and outside sources, the data modeling studio 109 allows users to create more accurate models and perform more accurate analysis.

In some embodiments, a model created using the data modeling studio 109 may output an alert related one or more potential problems and present a user with one or more actions that can be implemented in the process plant to solve the potential problems, for example, adjusting the pressure of a valve.

In some embodiments, the data modeling studio 109 may be used to perform operations concerning the health and status of plant equipment. The user may use the graphic user interface 300 of the data modeling studio 109 to select one or more data source templates 129*a* that indicate data sources that collect data on the status of plant equipment, for example pressure flow, value pressure, vibration data, etc. The data source templates 129*a* may include historical data relating to alerts, maintenance reports, when plant equipment has broken down in the past, etc. The model may also include one or more data source templates 129*a* indicating data sources that collect real time data, such as vibration reading of the equipment. The data streams may be received in real time or near real time from one or more plant entities, may be historical data, data from another process plant, etc. The user may also select one or more modeling and/or analysis templates and enter the data source templates 129*a* as an input into the modeling and/or analysis templates.

In one example scenario, a certain combination of events in a process plant leads to poor product quality when the product is eventually generated at a later time (e.g., several hours after the occurrence of the combination of events). The operator is ignorant of the relationship between the occurrence of the events and the product quality. Rather than detecting and determining the poor product quality several hours hence and trouble-shooting to determine the root causes of the poor product quality (as is currently done in known process control systems), the user may create and execute a model to detect the combination of events at or shortly after their occurrence, e.g., when the data corresponding to the events' occurrences is transmitted to the appliance 102. The model output of the model may be a prediction of the poor product quality based on the occurrence of these events, an alert an operator of the prediction, and/or may be process data to adjust or change one or more parameters or processes in real-time to mitigate the effects of the combination of events. For example, the output of the model may be a revised set point or revised parameter values. The user may use the output of the model to further refine the model, create a new model, run the same model on different data, etc. Because the data modeling studio 109 has access to the comprehensive, high fidelity data stored in the big data machine 102, it is not necessary to define any or all of the various parameters of a process plant to be collected and used in the knowledge discovery method 110 before running the method. Thus, the data modeling studio 109 does not require users to select the data they want first and configure plant equipment to collect that desired data prior to processing the data. In this manner, the models configured and executed by the data modeling studio 109 allow problems to be discovered and potentially mitigated much more quickly and efficiently as compared to currently known process control systems.

In another example scenario, a model may be utilized to detect changes in product operation. For instance, the model may output a detected change in certain communication rates, and/or from changes or patterns of parameter values received from a sensor or from multiple sensors over time which may indicate that system dynamics may be changing. In yet another example scenario, a model may be utilized to diagnose and determine that a particular batch of valves or other supplier equipment are faulty based on the behavior of processes and the occurrences of alarms during operation of the process plant.

In another example scenario, a model may simulate operation of a process plant and predict product capabilities, such as vaccine potency. A model may even be created to monitor and detect potential security issues associated with the process plant 10, such as increases in log-in patterns, retries, and their respective locations across multiple plants and/or plant sites. In this manner, a company that owns or operates multiple process plants to glean diagnostic and/or prognostic information on a region, an industry, or a company-wide basis.

As discussed above in reference to FIGS. 2-4, a user may select data source templates 129a to graphically depict data to be included in a model created using the data modeling studio 109. However, in some embodiments, a user may use a data explorer 155 to select data sources to be included in the model. Although discussed in reference to the data modeling studio 109, it will be appreciated that the data explorer 155 may also be accessed by the data knowledge application 114 for data exploration, exploration, etc.

Figure 5:
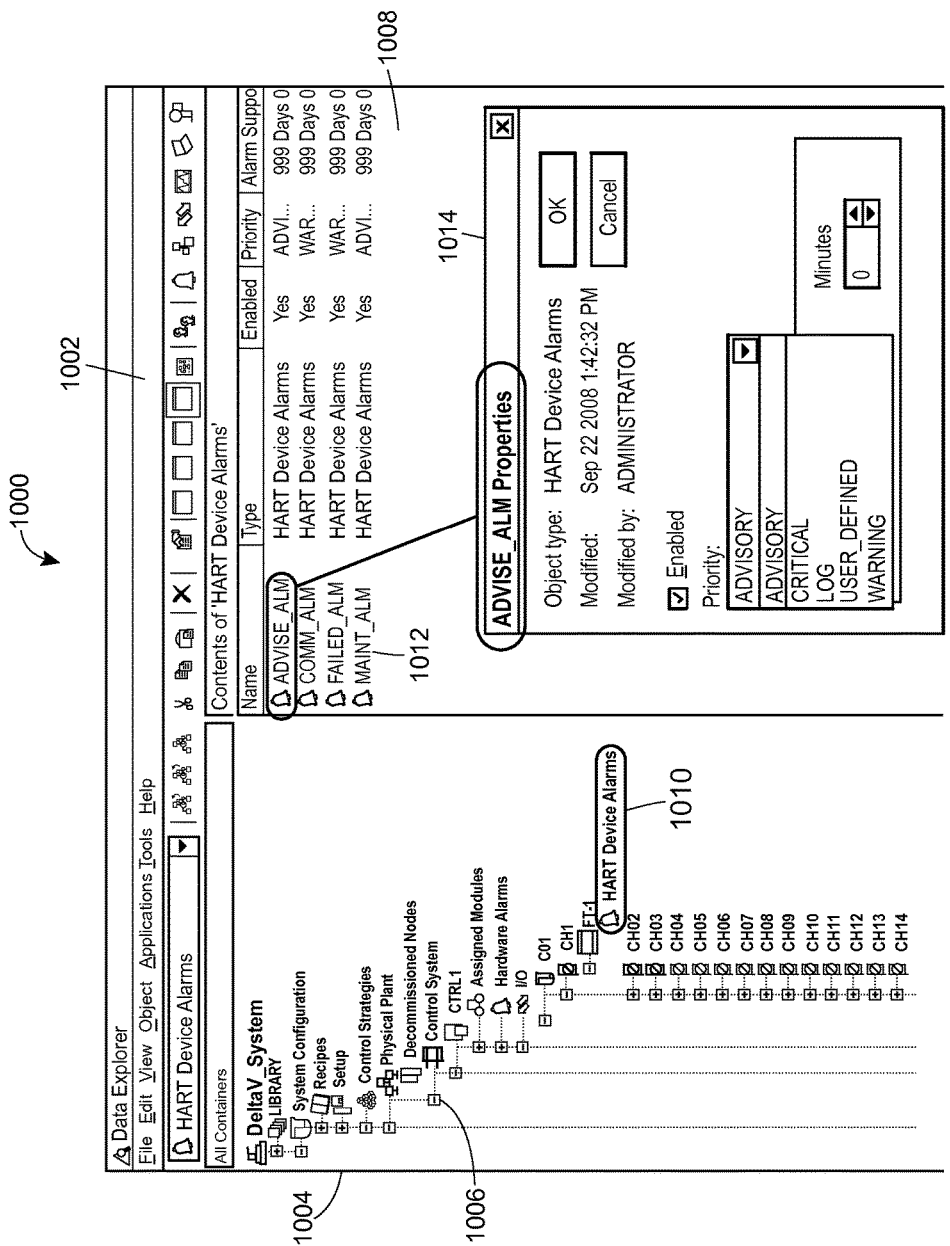
FIG. 5 is a screen presentation of a data explorer that may be used to create or execute models.

Turning now to FIG. 5, a user interface 1000 of the data explorer 155 is illustrated. The user interface 1000 of the data explorer 155 provides a graphical view of the hierarchical relationships between the various hardware and software components in a process plant (such as the process plant 10). The data explorer 155 displays the particular pieces of plant equipment used in a particular process plant as well as the various software components, such as control routines, used to operate the particular pieces of plant equipment in the particular process plant.

In this manner, the data explorer 155 provides access to data stored in the process control system big data storage area 102. Data may be historized data including time-series data points 120a that have been collected during runtime of the process control system 10 and have been stored (along with any corresponding metadata 120b) in the process control system big data storage area 120. For example, the historized data may include indications of control routines, parameters and parameter values, batch recipes, configurations, etc., used during the operation of the process plant 10, and the historized data may include indications of user actions that occurred during the operation of the process plant 10 or related activities.

The user of the data modeling studio 109 may wish to explore certain definitions and may enter an input selecting the data explorer tool button 714 to execute the data explorer. Once the data explorer tool is executed, the user interface 1000 of FIG. 5 may be displayed. The user interface 1000 may include a main control window 1002 that may include textual pull down menus, pictographic menus, and other options. The user interface 1002 may also include a side bar 1004, that allows the user to view definitions in terms of hierarchical relationship. Example hierarchical systems include control system, operations and physical plant. The control system hierarchy may display definitions corresponding to various control routines used in the plant. The operations hierarchy may display definitions corresponding to operations that can be performed by the process plant or may be performed by the data modeling studio using the modeling and/or analysis definitions. The physical plant hierarchy may display the physical devices deployed in the process plant. Of course these hierarchical systems are just examples and other systems and/or combination of systems may be used. Furthermore, each hierarchy may have one or more sub-hierarchies. Certain data sources may also belong to two or more hierarchical systems. For example, a controller may be included in the control system hierarchy as well as the physical plant hierarchy.

The data explorer 155 allows the user to select an overarching hierarchy (i.e. physical plant) and select a visual indicator 1006 to "drill down" to see data objects relating to or belonging to that hierarchy. The user may also wish to explore certain data sources, by executing a data explorer tool to view the data in a hierarchical structure. The data explorer 155 allows the user to explore data sources stored in the big data appliance 102 that collects and stores all (or almost all) process data and plant data collected as part of the big data architecture of the process plant 10. The data may include comprehensive, high fidelity data stored in the big data appliance 102, defining any or all of the various parameters of the process plant 10 implementing a big data architecture. A user may explore historized or stored data 120 using the data explorer 155. The data explorer 155 may enable a user to view or visualize at least portions of the stored data 120 based on the data stream definitions 170 (and in some cases, based on at least some of the analysis definitions 172). For example, the data explorer 155 may allow a user to pull temperature data of a particular vat from a particular time period, and to apply a trending analysis to view the changes in temperature during that time period. In another example, the data explorer 155 may allow a user to perform a regression analysis to determine independent or dependent variables affecting the vat temperature. The user may also select data to be displayed in more detail in main screen presentation 1008. For example, the user may "drill down" the physical plant hierarchy and drill down the hardware alarms hierarchy.

The data modeling studio as described herein provides a robust and efficient architecture for graphically creating and executing models. In embodiments where the data modeling studio 109 is implemented in a process plant utilizing a big data architecture that includes a big data appliance that collects and stores all (or almost all) process data and plant data collected, the user may use the interface routine 300 of the data modeling studio 109 to graphically edit and iterate models without having to reconfigure the plant operation to collect additional data which makes for a must faster model development environment.

As one example, a user may believe that a temperature reading is correlated to the quality of a product produced by a process plant (such as the process plant 109). Accordingly, the user may use the graphical user interface 300 of the data modeling studio 109 to create a model that performs a correlation routine on product quality data and temperature data. Accordingly, the user may select a first data source template 129a corresponding to a temperature reading, a second data source template 129b corresponding to a quality of a product and a function template 129b corresponding to a correlation routine. The user may further use the data flow templates 129d to indicate that the first and second data source templates 129a are to be input into the correlation routine. The user may also select an output template 129c indicating that the result of the correlation routine (for example a correlation percentage) is output to a dashboard. The user may then execute the model using the run time engine 124. However, the output of the executed model may indicate that the temperature reading is not correlated to the quality of the product. The user may in turn wish to re-run the correlation model on a different data input, for example, valve pressure data.

Traditionally, the user would have to then configure the process plant to collect the valve pressure data during operation. Due to the limitations of prior process control systems, collecting the valve pressure data may involve running the process plant to produce the product and collecting the valve pressure data at the rate required for the model. The process of re-running the process plant to collect the valve pressure data could take hours, days and even months to collect enough data to execute an accurate model. Furthermore, in the time that the process plant is re-running and data is being collected, the plant may be running sub optimally because the user hasn't determined which, if any, process control data is correlated to product quality.

Because the data modeling studio 109 has access to all of the plant data available in a big data machine, the valve pressure data is already recorded and all the user has to do to adjust the model is simply select a data source template 129a (from the library region 125a of the graphic user interface 300 of the data modeling studio 109) corresponding to the value pressure data. In fact, the user may use the data modeling studio 109 to create a model that automatically re-runs the correlation functions on different data sources within the process plant to determine which, if any, values correspond to product quality. The user may further improve the accuracy of the model created using the data modeling studio 109 by using the hierarchical systems presented in the interface 1000 of the data explorer 155 and selecting process control data from particular pieces of plant equipment used in the particular process plant.

Of course, this is just one simplified example of what can be done with the data modeling studio 109. Those of ordinary skill in the art can appreciate that as the model creation becomes more complex and the data requirements for accurate models is more stringent, the ease of use of the data modeling studio 109 and the robustness of the high fidelity data from the big data appliance 102 allow for the creation of more comprehensive and accurate models.

Figure 6:
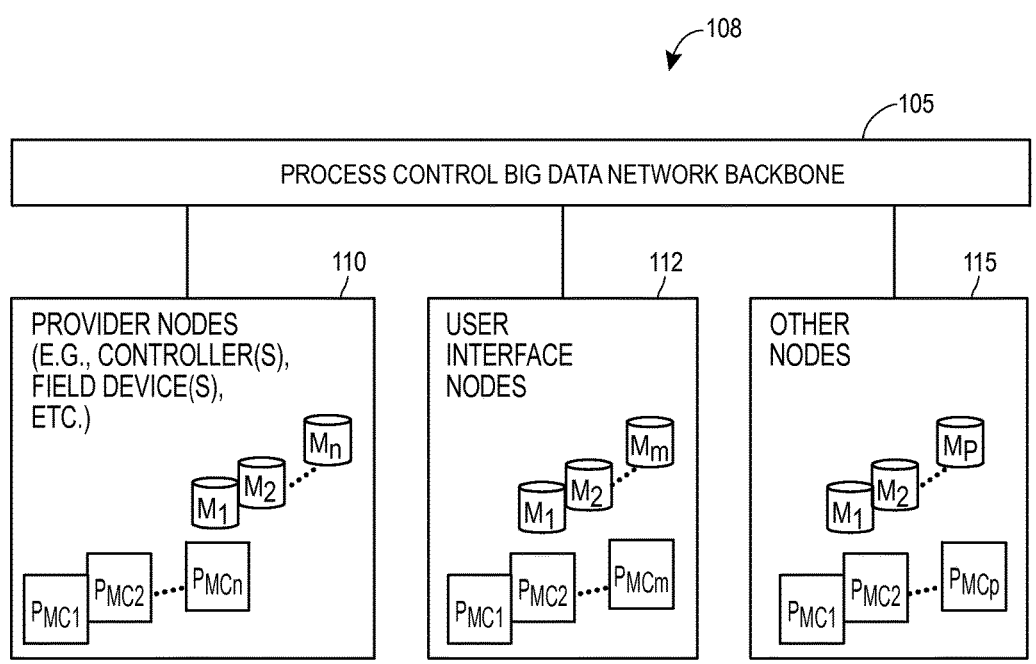
FIG. 6 is a block diagram illustrating an example arrangement of several groups of nodes in an example big data network for a process plant or process control system.

Turning now to FIG. 6, the plurality of nodes 108 (illustrated in FIG. 1) are discussed in further detail. The plurality of notes 108 of the process control big data network 100 may include several different groups of nodes 110-115 and the data modeling studio 109 and/or data knowledge application 114 may retrieve data from one or more nodes 108 in communicative connection with the process control system big data network 100 (illustrated in FIG. 1). Furthermore, a model executed by the run time engine of the data modeling studio 109 (illustrated in FIG. 1) may output data (e.g. process control data) to one or more nodes 108, as described in detail below, for execution at those nodes. A first group of nodes 110, referred to herein as "provider nodes 110" or "provider devices 110," may include one or more nodes or devices that generate, route, and/or receive process control data to enable processes to be controlled in real-time in a process plant environment (such as the process plant 10). Examples of provider devices or nodes 110 include devices whose primary function is directed to generating and/or operating on process control data to control a process, e.g., wired and wireless field devices (such as sensors and valves), controllers, or input/output (I/O devices). Other examples of provider devices 110 may include devices whose primary function is to provide access to or routes through one or more communication networks of the process control system (of which the process control big network 100 is one), e.g., access points, routers, interfaces to wired control busses, gateways to wireless communication networks, gateways to external networks or systems, and other such routing and networking devices. Still other examples of provider devices 110 may include devices whose primary function is to temporarily store process data and other related data that is accumulated throughout the process control system 10 and to cause the temporarily stored data to be transmitted for historization at the process control system big data appliance 102 (illustrated in FIG. 1).

At least one of the provider devices 110 may be communicatively connected to the process control big data network backbone 105 in a direct manner or in an indirect manner. For example, a wireless field device may be communicatively connected to the backbone 105 via a router, an access point, and/or a wireless gateway. Typically, provider devices 110 do not have an integral user interface, although some of the provider devices 100 may have the capability to be in communicative connection with a user computing device or user interface, e.g., by communicating over a wired or wireless communication link, or by plugging a user interface device into a port of the provider device 110.

A second group of nodes 112, referred to herein as "user interface nodes 112" or "user interface devices 113," may include one or more nodes or devices that each have an integral user interface via which a user or operator may interact with the data modeling studio 109 and/or the data knowledge application 114. Examples of these user interface nodes or devices 112 may include mobile or stationary computing devices, workstations, handheld devices, tablets, surface computing devices, smart phones, and any other computing device having a processor, a memory, and an integral user interface. Integrated user interfaces may include a screen, a keyboard, keypad, mouse, buttons, touch screen, touch pad, biometric interface, speakers and microphones, cameras, and/or any other user interface technology. Each user interface node 112 may include one or more integrated user interfaces. Moreover, user interface nodes 112 may include a direct connection to the process control big data network backbone 105, or may include in indirect connection to the backbone 105, e.g., via an access point or a gateway. User interface nodes 112 may communicatively connect to the process control system big data network backbone 105 in a wired manner and/or in a wireless manner. In some embodiments, a user interface node 112 may connect to the network backbone 105 in an ad-hoc manner.

Of course, the plurality of nodes 108 of the process control big data network 100 is not limited to only provider nodes 110 and user interface nodes 112. One or more other types of nodes 115 may also be included in the plurality of nodes 108. For example, a node of a system that is external to the process plant 10 (e.g., a lab system or a materials handling system) may be communicatively connected to the network backbone 105 of the system 100. A node or device 115 may be communicatively connected to the backbone 105 via a direct or an indirect connection and or may be communicatively connected to the backbone 105 via a wired or a wireless connection. In some embodiments, the group of other nodes 115 may be omitted from the process control system big data network 100.

At least some of the nodes 108 may each include respective memory storage (denoted in FIG. 1 by the icons $M_X$) to store or cache tasks, measurements, events, and other data in real-time. A memory storage $M_X$ may include high density memory storage technology, for example, solid state drive memory, semiconductor memory, optical memory, molecular memory, biological memory, or any other suitable high density memory technology. However, the memory storage $M_X$ may also include flash memory, hard drives, or any other types of memory. The memory storage $M_X$ (and, in some cases, the flash memory) may be configured to temporarily store or cache data that is generated by, received at, or otherwise observed by its respective node 108. The flash memory $M_X$ of at least some of the nodes 108 (e.g., a controller device) may also store snapshots of node configuration, batch recipes, and/or other data to minimize delay in using this information during normal operation or after a power outage or other event that causes the node to be off-line. Of course, any or all of the nodes 110, 112 and any number of the nodes 115 may include high density memory storage $M_X$. It is understood that different types or technologies of high density memory storage $M_X$ may be utilized across the set of nodes 108, or across a subset of nodes included in the set of nodes 108.

Examples (but not a comprehensive list) of real-time data that may be cached or collected by provider nodes or devices 110 may include measurement data, control signal data, configuration data, batch data, event data, and/or continuous data. For instance, real-time data corresponding to configurations, batch recipes, setpoints, outputs, rates, control actions, diagnostics, alarms, events and/or changes thereto may be collected. Other examples of real-time data may include process models, statistics, status data, and network and plant management data.

Examples of real-time data that may be cached or collected by user interface nodes or devices 112 may include, for example, user logins, user queries, data captured by a user (e.g., by camera, audio, or video recording device), user commands, creation, modification or deletion of files, a physical or spatial location of a user interface node or device, results of a diagnostic or test performed by the user interface device 113, and other actions or activities initiated by or related to a user interacting with a user interface node 112.

Collected data may be dynamic or static data and may include, for example, database data, streaming data, and/or transactional data. Generally, any data that a node 108 generates, receives, or observes may be collected or cached with a corresponding time stamp or indication of a time of collection/caching. In a preferred embodiment, all data that a node 108 generates, receives, or observes is collected or cached in its memory storage (e.g., high density memory storage $M_X$) with a respective indication of a time of each datum's collection/caching (e.g., a time stamp).

Each of the nodes 110, 112 (and, optionally, at least one of the other nodes 115) may be configured to automatically collect or cache real-time data and to cause the collected/cached data to be delivered to the big data appliance 102 and/or to other nodes 108 without requiring lossy data compression, data sub-sampling, or configuring the node for data collection purposes. Unlike prior art process control systems, the identity of data that is collected at the nodes or devices 108 of the process control system big data network 100 need not be configured into the devices 108 a priori. Further, the rate at which data is collected at and delivered from the nodes 108 also need not be configured, selected or defined. Instead, the nodes 110, 112 (and, optionally, at least one of the other nodes 115) of the process control big data system 100 may automatically collect all data that is generated by, received at, or obtained by the node at the rate at which the data is generated, received or obtained, and may cause the collected data to be delivered in high fidelity (e.g., without using lossy data compression or any other techniques that may cause loss of original information) to the process control big data appliance 102 and, optionally, to other nodes 108 of the network 100.

Figure 7:
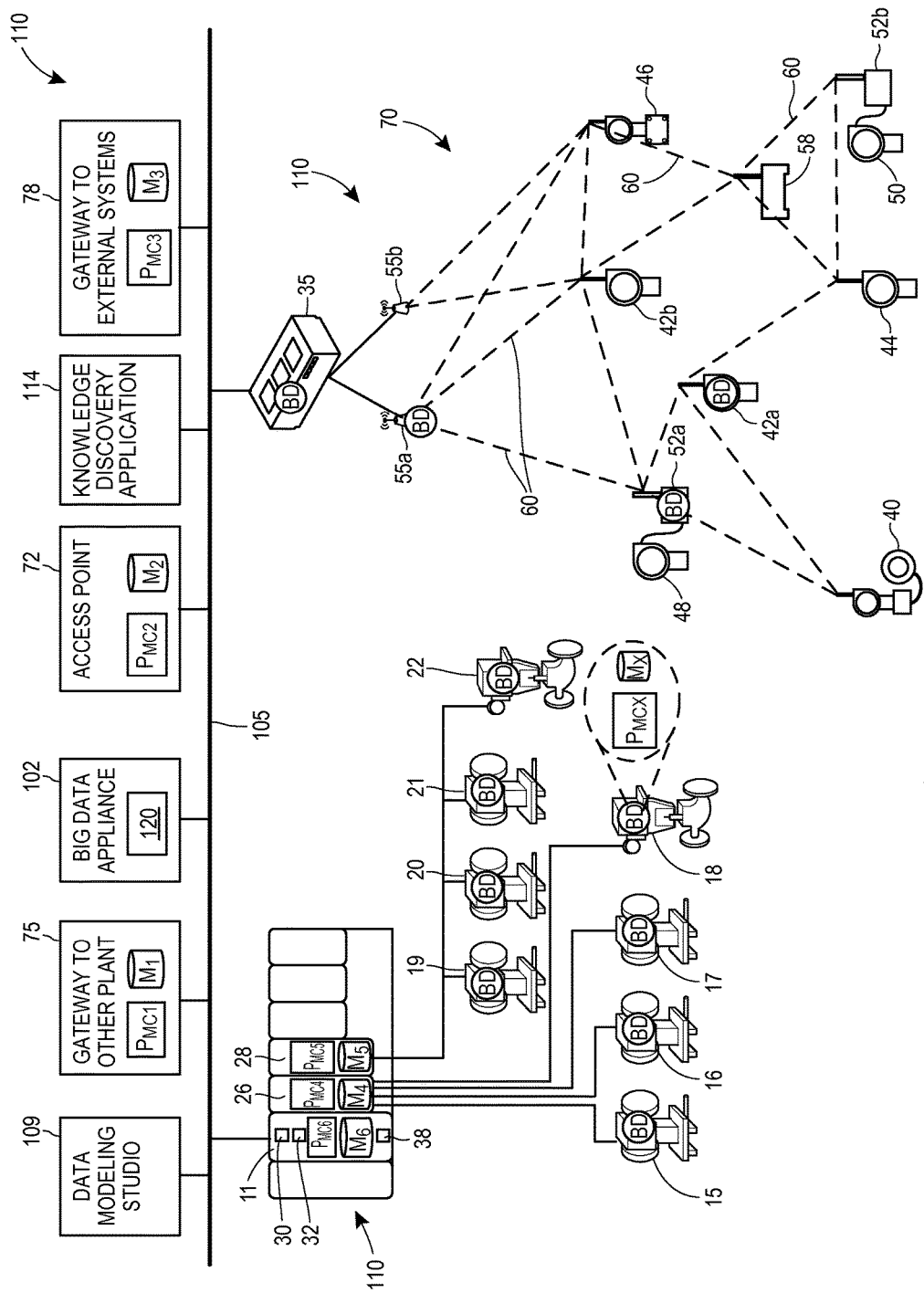
FIG. 7 is a block diagram illustrating an example arrangement of provider nodes that collect data for use by models created and executed using a data modeling studio.

A detailed block diagram illustrating example provider nodes 110 connected to process control big data network backbone 105 is illustrated in FIG. 7. More specifically, the provider nodes may be used to collect and cache data collected from the process plant 10 and stored in the data storage area 120. The data source templates 129a (used to construct models in the graphic user interface 300 of the data modeling studio 109) are graphical representations or pointers to the data stored in the data storage area 120. In this manner, all of the data collected in the big data process control network 100 and stored in the data storage area 120 is available to a user of the data modeling studio 109 and data knowledge application 114.

As previously discussed, provider nodes 110 may include one or more devices whose main function is to automatically generate and/or receive process control data that is used to perform functions to control a process in real-time in the process plant environment 10, such as process controllers, field devices and I/O devices. In a process plant environment 10, process controllers typically receive signals indicative of process measurements made by field devices, process this information to implement a control routine, and generate control signals that are sent over wired or wireless communication links to other field devices to control the operation of a process in the plant 10. Typically, at least one field device performs a physical function (e.g., opening or closing a valve, increase or decrease a temperature, a burner flame, a fan speed, etc.) to control the operation of a process, and some types of field devices may communicate with controllers using I/O devices. Process controllers, field devices, and I/O devices may be wired or wireless, and any number and combination of wired and wireless process controllers, field devices and I/O devices may be included within the nodes 110 of the process control big data network 100.

As illustrated in FIG. 7, the controller 11 is communicatively connected to wired field devices 15-22 via input/output (I/O) cards 26 and 28, and is communicatively connected to wireless field devices 40-46 via a wireless gateway 35 and the network backbone 105. (In another embodiment, though, the controller 11 may be communicatively connected to the wireless gateway 35 using a communications network other than the backbone 105, such as by using another wired or a wireless communication link.) In FIG. 7, the controller 11 is shown as being a node 110 of the process control system big data network 100, and is directly connected to the process control big data network backbone 105.

The controller 11, which may be, by way of example, the DeltaV™ controller sold by Emerson Process Management, may operate to implement a batch process or a continuous process using at least some of the field devices 15-22 and 40-46. The controller 11 may be communicatively connected to the field devices 15-22 and 40-46 using any desired hardware and software associated with, for example, standard 4-20 ma devices, I/O cards 26, 28, and/or any smart communication protocol such as the FOUNDATION® Fieldbus protocol, the HART® protocol, the WirelessHART® protocol, etc. The controller 11 may be additionally or alternatively communicatively connected with at least some of the field devices 15-22 and 40-46 using the big data network backbone 105. In the embodiment illustrated in FIG. 7, the controller 11, the field devices 15-22 and the I/O cards 26, 28 are wired devices, and the field devices 40-46 are wireless field devices. Of course, the wired field devices 15-22 and wireless field devices 40-46 could conform to any other desired standard(s) or protocols, such as any wired or wireless protocols, including any standards or protocols developed in the future.

The controller 11 of FIG. 7 includes a processor 30 that implements or oversees one or more process control routines (stored in a memory 32), which may include control loops. The processor 30 may communicate with the field devices 15-22 and 40-46 and with other nodes (e.g., nodes 110, 112, 115) that are communicatively connected to the backbone 105 in order to perform control activities. It should be noted that any of the control routines or modules (including quality prediction and fault detection modules or function blocks) described herein may have parts thereof implemented or executed by different controllers or other devices if so desired. Likewise, the control routines or modules described herein which are to be implemented within the process control system 10 may take any form, including software, firmware, hardware, etc. Control routines may be implemented in any desired software format, such as using object oriented programming, ladder logic, sequential function charts, function block diagrams, or using any other software programming language or design paradigm. The control routines may be stored in any desired type of memory, such as random access memory (RAM), or read only memory (ROM) Likewise, the control routines may be hard-coded into, for example, one or more EPROMs, EEPROMs, application specific integrated circuits (ASICs), or any other hardware or firmware elements. Thus, the controller 11 may be configured to implement a control strategy or control routine in any desired manner.

In some embodiments, the controller 11 implements a control strategy using what are commonly referred to as function blocks, wherein each function block is an object or other part (e.g., a subroutine) of an overall control routine and operates in conjunction with other function blocks (via communications called links) to implement process control loops within the process control system 10. Control based function blocks typically perform one of an input function, such as that associated with a transmitter, a sensor or other process parameter measurement device, a control function, such as that associated with a control routine that performs PID, fuzzy logic, etc. control, or an output function which controls the operation of some device, such as a valve, to perform some physical function within the process control system 10. Of course, hybrid and other types of function blocks exist. Function blocks may be stored in and executed by the controller 11, which is typically the case when these function blocks are used for, or are associated with standard 4-20 ma devices and some types of smart field devices such as HART devices, or may be stored in and implemented by the field devices themselves, which can be the case with Fieldbus devices. The controller 11 may include one or more control routines 38 that may implement one or more control loops. Each control loop is typically referred to as a control module, and may be performed by executing one or more of the function blocks.

The wired field devices 15-22 may be any types of devices, such as sensors, valves, transmitters, positioners, etc., while the I/O cards 26 and 28 may be any types of I/O devices conforming to any desired communication or controller protocol. In the embodiment illustrated in FIG. 7, the field devices 15-18 are standard 4-20 ma devices or HART devices that communicate over analog lines or combined analog and digital lines to the I/O card 26, while the field devices 19-22 are smart devices, such as FOUNDATION® Fieldbus field devices, that communicate over a digital bus to the I/O card 28 using a Fieldbus communications protocol. In some embodiments, though, at least some of the wired field devices 15-22 and/or at least some of the I/O cards 26, 28 may communicate with the controller 11 using the big data network backbone 105. In some embodiments, at least some of the wired field devices 15-22 and/or at least some of the I/O cards 26, 28 may be nodes of the process control system big data network 100.

In the embodiment shown in FIG. 7, the wireless field devices 40-46 communicate in a wireless network 70 using a wireless protocol, such as the WirelessHART protocol. Such wireless field devices 40-46 may directly communicate with one or more other nodes 108 of the process control big data network 100 that are also configured to communicate wirelessly (using the wireless protocol, for example). To communicate with one or more other nodes 108 that are not configured to communicate wirelessly, the wireless field devices 40-46 may utilize a wireless gateway 35 connected to the backbone 105 or to another process control communication network. In some embodiments, at least some of the wireless field devices 40-46 may be nodes of the process control system big data network 100.

The wireless gateway 35 is an example of a provider device 110 that may provide access to various wireless devices 40-58 of a wireless communication network 70. In particular, the wireless gateway 35 provides communicative coupling between the wireless devices 40-58, the wired devices 11-28, and/or other nodes 108 of the process control big data network 100 (including the controller 11 of FIG. 7).

For example, the wireless gateway 35 may provide communicative coupling by using the big data network backbone 105 and/or by using one or more other communications networks of the process plant 10.

The wireless gateway 35 provides communicative coupling, in some cases, by the routing, buffering, and timing services to lower layers of the wired and wireless protocol stacks (e.g., address conversion, routing, packet segmentation, prioritization, etc.) while tunneling a shared layer or layers of the wired and wireless protocol stacks. In other cases, the wireless gateway 35 may translate commands between wired and wireless protocols that do not share any protocol layers. In addition to protocol and command conversion, the wireless gateway 35 may provide synchronized clocking used by time slots and superframes (sets of communication time slots spaced equally in time) of a scheduling scheme associated with the wireless protocol implemented in the wireless network 70. Furthermore, the wireless gateway 35 may provide network management and administrative functions for the wireless network 70, such as resource management, performance adjustments, network fault mitigation, monitoring traffic, security, and the like. The wireless gateway 35 may be a node 110 of the process control system big data network 100.

Similar to the wired field devices 15-22, the wireless field devices 40-46 of the wireless network 70 may perform physical control functions within the process plant 10, e.g., opening or closing valves or take measurements of process parameters. The wireless field devices 40-46, however, are configured to communicate using the wireless protocol of the network 70. As such, the wireless field devices 40-46, the wireless gateway 35, and other wireless nodes 52-58 of the wireless network 70 are producers and consumers of wireless communication packets.

In some scenarios, the wireless network 70 may include non-wireless devices. For example, a field device 48 of FIG. 7 may be a legacy 4-20 mA device and a field device 50 may be a traditional wired HART device. To communicate within the network 70, the field devices 48 and 50 may be connected to the wireless communication network 70 via a wireless adaptor (WA) 52*a* or 52*b*. Additionally, the wireless adaptors 52*a*, 52*b* may support other communication protocols such as Foundation® Fieldbus, PROFIBUS, DeviceNet, etc. Furthermore, the wireless network 70 may include one or more network access points 55*a*, 55*b*, which may be separate physical devices in wired communication with the wireless gateway 35 or may be provided with the wireless gateway 35 as an integral device. The wireless network 70 may also include one or more routers 58 to forward packets from one wireless device to another wireless device within the wireless communication network 70. The wireless devices 32-46 and 52-58 may communicate with each other and with the wireless gateway 35 over wireless links 60 of the wireless communication network 70.

Accordingly, FIG. 7 includes several examples of provider devices 110 which primarily serve to provide network routing functionality and administration to various networks of the process control system. For example, the wireless gateway 35, the access points 55*a*, 55*b*, and the router 58 include functionality to route wireless packets in the wireless communication network 70. The wireless gateway 35 performs traffic management and administrative functions for the wireless network 70, as well as routes traffic to and from wired networks that are in communicative connection with the wireless network 70. The wireless network 70 may utilize a wireless process control protocol that specifically supports process control messages and functions, such as WirelessHART.

The provider nodes 110 of the process control big data network 100, though, may also include other nodes that communicate using other wireless protocols. For example, the provider nodes 110 may include one or more wireless access points 72 that utilize other wireless protocols, such as WiFi or other IEEE 802.11 compliant wireless local area network protocols, mobile communication protocols such as WiMAX (Worldwide Interoperability for Microwave Access), LTE (Long Term Evolution) or other ITU-R (International Telecommunication Union Radiocommunication Sector) compatible protocols, short-wavelength radio communications such as near field communications (NFC) and Bluetooth, or other wireless communication protocols. Typically, such wireless access points 72 allow handheld or other portable computing devices (e.g., user interface devices 113) to communicative over a respective wireless network that is different from the wireless network 70 and that supports a different wireless protocol than the wireless network 70. In some scenarios, in addition to portable computing devices, one or more process control devices (e.g., controller 11, field devices 15-22, or wireless devices 35, 40-58) may also communicate using the wireless supported by the access points 72.

Additionally or alternatively, the provider nodes 110 may include one or more gateways 75, 78 to systems that are external to the immediate process control system 10. Typically, such systems are customers or suppliers of information generated or operated on by the process control system 10. For example, a plant gateway node 75 may communicatively connect the immediate process plant 10 (having its own respective process control big data network backbone 105) with another process plant having its own respective process control big data network backbone. If desired, a single process control big data network backbone 105 may service multiple process plants or process control environments.

In another example, a plant gateway node 75 may communicatively connect the immediate process plant 10 to a legacy or prior art process plant that does not include a process control big data network 100 or backbone 105. In this example, the plant gateway node 75 may convert or translate messages between a protocol utilized by the process control big data backbone 105 of the plant 10 and a different protocol utilized by the legacy system (e.g., Ethernet, Profibus, Fieldbus, DeviceNet, etc.).

The provider nodes 110 may include one or more external system gateway nodes 78 to communicatively connect the process control big data network 100 with the network of an external public or private system, such as a laboratory system (e.g., Laboratory Information Management System or LIMS), an operator rounds database, a materials handling system, a maintenance management system, a product inventory control system, a production scheduling system, a weather data system, a shipping and handling system, a packaging system, the Internet, another provider's process control system, or other external systems.

Although FIG. 7 only illustrates a single controller 11 with a finite number of field devices 15-22 and 40-46, this is only an illustrative and non-limiting embodiment. Any number of controllers 11 may be included in the provider nodes 110 of the process control big data network 100, and any of the controllers 11 may communicate with any number of wired or wireless field devices 15-22, 40-46 to control a process in the plan 10. Furthermore, the process plant 10 may also include any number of wireless gateways 35, routers 58, access points 55, wireless process control communication networks 70, access points 72, and/or gateways 75, 78.

As previously discussed, one or more of the provider nodes 110 may include a respective multi-core processor $P_{MCX}$, a respective high density memory storage $M_X$, or both a respective multi-core processor $P_{MCX}$ and a respective high density memory storage $M_X$ (denoted in FIG. 7 by the icon BD). Each provider node 100 may utilize its memory storage $M_X$ (and, in some embodiments, its flash memory) to collect and cache data. Each of the nodes 110 may cause its cached data to be transmitted to the process control system big data appliance 102. For example, a node 110 may cause at least a portion of the data in its cache to be periodically transmitted to the big data appliance 102. Alternatively or additionally, the node 110 may cause at least a portion of the data in its cached to be streamed to the big data appliance 102. In one case, the process control system big data appliance 102 may be a subscriber to a streaming service that delivers the cached or collected data from the node 110. In another case, the provider node 110 may host the streaming service.

For nodes 110 that have a direct connection with the backbone 105 (e.g., the controller 11, the plant gateway 75, the wireless gateway 35), the respective cached or collected data may be transmitted directly from the node 110 to the process control big data appliance 102 via the backbone 105, in an embodiment. For at least some of the nodes 110, though, the collection and/or caching may be leveled or layered, so that cached or collected data at a node that is further downstream (e.g., is further away) from the process control big data appliance 102 is intermediately cached at a node that is further upstream (e.g., is closer to the big data appliance 102).

To illustrate an example of layered or leveled data caching, a field device 22 caches process control data that it generates or receives, and causes the contents of its cache to be delivered to an "upstream" device included in the communication path between the field device 22 and the process control big data appliance 102, such as the I/O device 28 or the controller 11. For example, the field device 22 may stream the contents of its cache to the I/O device 28, or the field device 22 may periodically transmit the contents of its cache to the I/O device 28. The I/O device 28 caches the information received from the field device 22 in its memory $M_5$ (and, in some embodiments, may also cache data received from other downstream field devices 19-21 in its memory $M_5$) along with other data that the I/O device 28 directly generates, receives and observes. The data that is collected and cached at the I/O device 28 (including the contents of the cache of the field device 22) may then be periodically transmitted and/or streamed to the upstream controller 11. Similarly, at the level of the controller 11, the controller 11 caches information received from downstream devices (e.g., the I/O cards 26, 28, and/or any of the field devices 15-22) in its memory $M_6$, and aggregates, in its memory $M_6$, the downstream data with data that the controller 11 itself directly generates, receives and observes. The controller 11 may then periodically deliver and/or stream the aggregated collected or cached data to the process control big data appliance 102. In this manner, the field devices 22 provide the user of the data modeling studio 109 and/or data knowledge application 114 access to real time or near real time data.

In a second example scenario of layered or leveled caching, the controller 11 controls a process using wired field devices (e.g., one or more of the devices 15-22) and at least one wireless field device (e.g., wireless field device 44). In a first embodiment of this second example scenario, the cached or collected data at the wireless device 44 is delivered and/or streamed directly to the controller 11 from the wireless device 44 (e.g., via the big data network 105), and is stored at the controller cache $M_6$ along with data from other devices or nodes that are downstream from the controller 11. The controller 11 may periodically deliver or stream the data stored in its cache $M_6$ to the process control big data appliance 102.

In another embodiment of this second example scenario, the cached or collected data at the wireless device 44 may be ultimately delivered to the process control big data appliance 102 via an alternate leveled or layered path, e.g., via the device 42a, the router 52a, the access point 55a, and the wireless gateway 35. In this embodiment, at least some of the nodes 41a, 52a, 55a or 35 of the alternate path may cache data from downstream nodes and may periodically deliver or stream cached data to a node that is further upstream.

Accordingly, different types of data may be cached at different nodes of the process control system big data network 100 using different layering or leveling arrangements. In some cases, data corresponding to controlling a process may be cached and delivered in a layered manner using provider devices 110 whose primary functionality is control (e.g., field devices, I/O cards, controllers), whereas data corresponding to network traffic measurement may be cached and delivered in a layered manner using provider devices 110 whose primary functionality is traffic management (e.g., routers, access points, and gateways). If desired, data may be delivered via provider nodes or devices 110 whose primary function (and, in some scenarios, sole function) is to collect and cache data from downstream devices (referred to herein as "historian nodes"). For example, a leveled system of historian nodes or computing devices may be located throughout the network 100, and each node 110 may periodically deliver or stream cached data to a historian node of a similar level, e.g., using the backbone 105. Downstream historian nodes may deliver or stream cached data to upstream historian nodes, and ultimately the historian nodes that are immediately downstream of the process control big data appliance 102 may deliver or stream respective cached data for storage at the process control big data appliance 102.

Layered caching may also or additionally be performed by nodes 110 that communicate with each other using the process control system big data network backbone 105. Likewise, at least some of the nodes 110 may communicate cached data to other nodes 110 at a different level using another communication network and/or other protocol, such as HART, WirelessHART, Fieldbus, DeviceNet, WiFi, Ethernet, or other protocol.

Of course, while leveled or layered caching has been discussed with respect to provider nodes 110, the concepts and techniques may apply equally to user interface nodes 112 and/or to other types of nodes 115 of the process control system big data network 100. For example, a subset of the nodes 108 may perform leveled or layered caching, while another subset of the nodes 108 may cause their cached/collected data to be directly delivered to the process control big data appliance 102 without being cached or temporarily stored at an intermediate node. Additionally, historian nodes may cache data from multiple different types of nodes, e.g., from a provider node 110 and from a user interface node 112.

Figure 8:
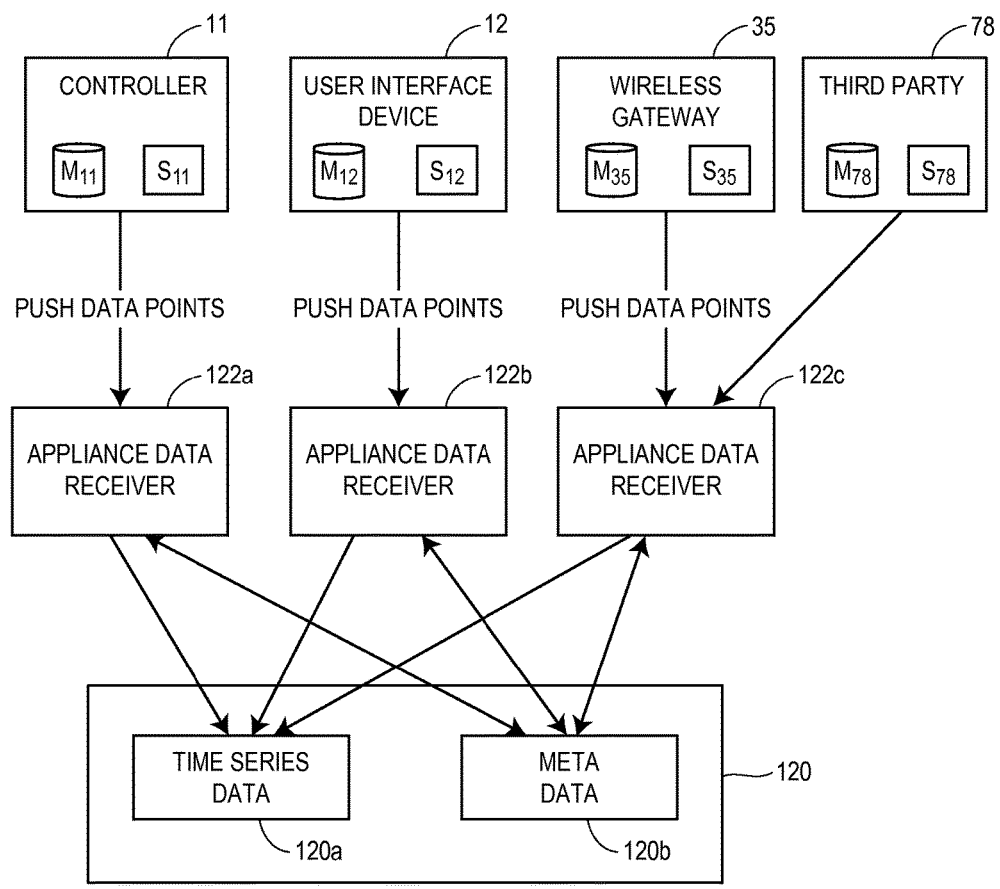
FIG. 8 is a block diagram illustrating an example use of appliance data receivers to store or historize data for use by models created and executed using a data modeling studio.

FIG. 8 is an example block diagram that illustrates more detailed concepts and techniques which may be achieved using the appliance data receivers 122 and the appliance request servicers 135 of the process control system big data appliance 102. More particularly, FIG. 8 is an example block diagram illustrating the use of the appliance data receivers 122 to transfer data (e.g., streamed data) from the nodes 108 of the process control big data network 100 to the big data appliance 102 for storage and historization. FIG. 8 illustrates four example nodes 108 of FIG. 1, i.e., the controller 11, a user interface device 12, the wireless gateway 35, and a gateway to a third party machine or network 78. However, the techniques and concepts discussed with respect to FIG. 8 may be applied to any type and any number of the nodes 108. Additionally, although FIG. 8 illustrates only three appliance data receivers 122a, 122b and 122c, the techniques and concepts corresponding to FIG. 8 may be applied to any type and any number of appliance data receivers 122.

In the embodiment illustrated in FIG. 8, each of the nodes 11, 12, 35 and 78 includes a respective scanner $S_{11}$, $S_{12}$, $S_{35}$, $S_{78}$ to capture data that is generated, received or otherwise observed by the node 11, 12, 35 and 78. The functionality of each scanner $S_{it}$, $S_{12}$, $S_{35}$, $S_{78}$ may be executed by a respective processor $P_{MCX}$ of the respective node 11, 12, 35, 78. The scanner $S_{11}$, $S_{12}$, $S_{35}$, $S_{78}$ may cause the captured data and a corresponding time stamp to be temporarily stored or cached in a respective local memory $M_{11}$, $M_{12}$, $M_{35}$, $M_{78}$, for example, in a manner such as previously described. As such, the captured data includes time-series data or real-time data. The captured data may be stored or cached in each of the memories $M_{11}$, $M_{12}$, $M_{35}$ and $M_{78}$ using the schema utilized by the process control big data storage area 120.

Each node 11, 12, 35 and 78 may transmit at least some of the cached data to one or more appliance data receivers 122a-122c, e.g., by using the network backbone 105. For example, at least one node 11, 12, 35, 78 may push at least some of the data from its respective memory $M_X$ when the cache is filled to a particular threshold. The threshold of the cache may be adjustable and at least one node 11, 12, 35, 78 may push at least some of data from its respective memory $M_X$ when a resource (e.g., a bandwidth of the network 105, the processor $P_{MCX}$, or some other resource) is sufficiently available. An availability threshold of a particular resource may be adjustable.

In some cases, at least one node 11, 12, 35, 78 may push at least some of the data stored in the memories $M_X$ at periodic intervals. The periodicity of a particular time interval at which data is pushed may be based on a type of the data, the type of pushing node, the location of the pushing node, and/or other criteria. The periodicity of a particular time interval may be adjustable. On the other hand, at least one node 11, 12, 35, 78 may provide data in response to a request (e.g., from the process control big data appliance 102).

In some cases, at least one node 11, 12, 35, 78 may stream at least some of the data in real-time as the data is generated, received or otherwise observed by each node 11, 12, 35, 78 (e.g., the node may not temporarily store or cache the data, or may store the data for only as long as it takes the node to process the data for streaming). For example, at least some of the data may be streamed to the one or more appliance data receivers 122 by using a streaming protocol. A node 11, 12, 35, 78 may host a streaming service, and at least one of the data receivers 122 and/or the data storage area 120 may subscribe to the streaming service.

Accordingly, transmitted data may be received by one or more appliance data receivers 122a-122c, e.g., via the network backbone 105. A particular appliance data receiver 122 may be designated to receive data from one or more particular nodes and/or a particular appliance data receiver 122 may be designated to receive data from only one or more particular types of devices (e.g., controllers, routers, or user interface devices). Additionally, a particular appliance data receiver 122 may be designated to receive only one or more particular types of data (e.g., network management data only or security-related data only).

The appliance data receivers 122a-122c may cause the data to be stored or historized in the big data appliance storage area 120. For example, the data received by each of the appliance data receivers 122a-122c may be stored in the data storage area 120 using the process control big data schema. In the embodiment shown in FIG. 8, the time series data 120a is illustrated as being stored separately from corresponding metadata 120b, although in some cases, at least some of the metadata 120b may be integrally stored with the time series data 120a.

Data that is received via the plurality of appliance data receivers 122a-122c may be integrated so that data from multiple sources may be combined (e.g., into a same group of rows of the data storage area 120). In some cases, data that is received via the plurality of appliance data receivers 122a-122c is cleaned to remove noise and inconsistent data. An appliance data receiver 122 may perform data cleaning and/or data integration on at least some of the received data before the received data is stored and/or the process control system big data appliance 102 may clean some or all of the received data after the received data has been stored in the storage area 102. A device or node (such as the nodes 110, 112, 115) may cause additional data related to the data contents to be transmitted, and the appliance data receiver 122 and/or the big data appliance storage area 120 may utilize this additional data to perform data cleaning. At least some data may be cleaned (at least partially) by a node 110, 112, 115 prior to the node 110, 112, 115 causing the data to be transmitted to the big data appliance storage area 120 for storage.

Figure 9:
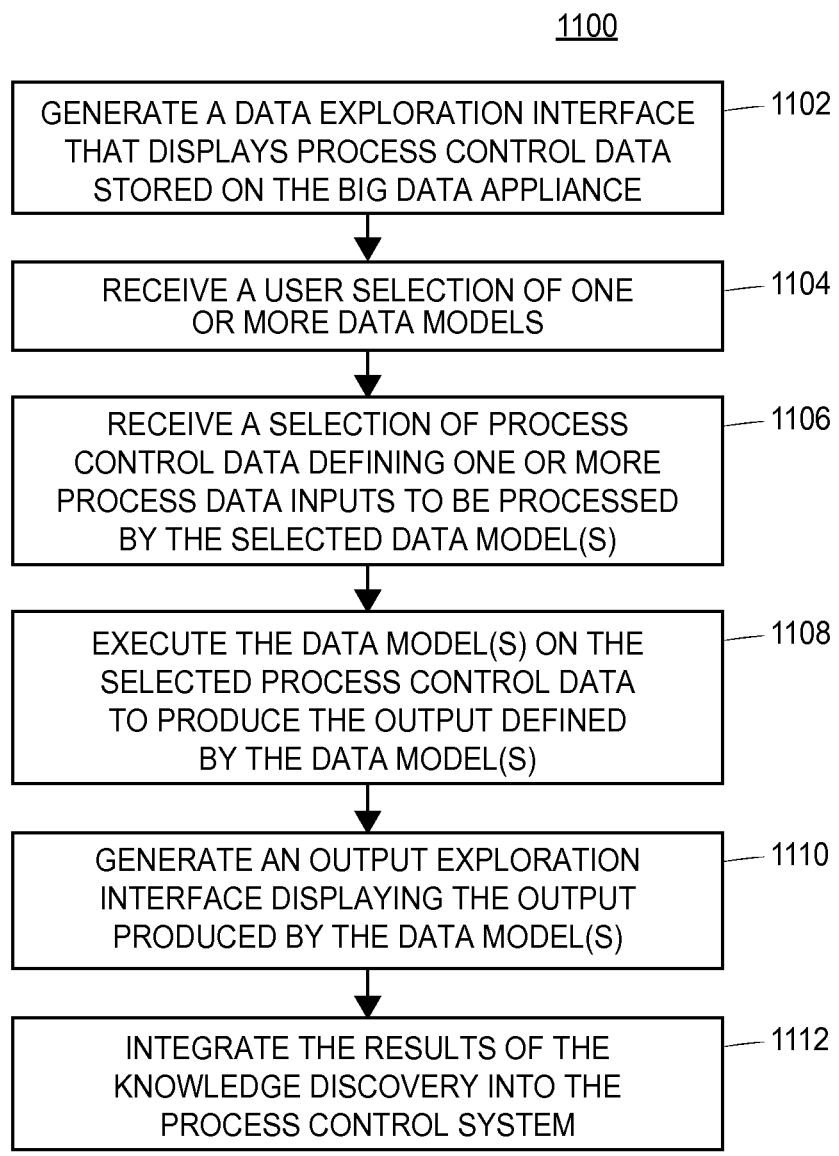
FIG. 9 is a flow diagram of an example knowledge discovery method 1100 executed in a process control system or process plant.

FIG. 9 illustrates a method 1100 for knowledge discovery utilizing models created with the data modeling studio 109. Generally speaking, the method 1100 for knowledge discovery may be executed by the knowledge discovery application 114, which receives indications of process control data that are of interest to a user, for example, and executes models that perform systematic and/or comprehensive diagnosis, prognosis, analysis, identifying relationships, etc., on that data to enable a user to discover and evaluate data retrieved from a process plant. In a general sense, the knowledge discovery method executed by the knowledge discovery application 114 allows a user to view and explore data stored in the big data appliance 102, select data from the big data appliance 102 and perform various operations on that data (using, for example, one or more of the data models created in the manner described above) to discover relationships, or other information that may be useful in more efficiently running the plant 10, minimizing errors or downtime in the plant 10, maximizing the quality of the plant outputs, etc. Furthermore, the data knowledge discovery application 114 may generate an output exploration interface that allows a user to view this information which may take the form of graphical depictions of the outputs of the models, for example, data values, charts, graphs, alarms, etc., as well as to view relationships between the output of the data models and the various software and hardware modules operating in the process plant.

In a general sense, the knowledge discovery method may be executed by one or more processors of the interface station 103 hosting the knowledge discovery application 114. In some embodiments, one or more of the steps of the method 1100 may be distributed among different devices in the process plant 10, such as one or more client device 113, one or more controllers 11, one or more nodes 108, etc. Furthermore, the output of one step of the method 1100 may be transmitted to the entity performing the next step.

A processor of one or more devices, such as the user interface station 103, may automatically execute the knowledge discovery method. The processor may access the knowledge discovery application 114 and the data used therein via the big data network or backbone 105 and may, in some cases, periodically execute one or data models as part of the knowledge discovery process, iteratively execute one or more data models as part of the knowledge discovery process, continuously execute one or more data models as part of the knowledge discovery process (e.g., in the background or automatically without user intervention, etc.), either during operation of the plant or after the plant has operated and plant data is stored in, for example, the big data appliance 102. Furthermore, the processor may execute the knowledge discovery application 114 in the background (i.e. operated by a device in the process control system without user interaction) or in the foreground (with user interaction). Background processes may be used to provide ongoing data mining, data modeling and other data analytic techniques as data is received from the process plant 10. In some embodiments, the data may be received in real time or near real time.

If desired, the knowledge discovery method may be iterative, so that after each step in the method, the one or more processors executing the method may use the output of one execution of a process or a data model used within the process as an input into a next step and/or to make adjustments based on a previous output. The knowledge discovery method 1100 may be automated or may include one or more manual steps performed by one or more users of, for example, the data modeling studio 109. A user may also configure one or more aspects of the knowledge discovery method, using the knowledge discovery application 114. The method 1100 may provide one or more outputs in the form of, for example, instructions to alert a user at one or more times during the execution of the method 1100, a suggested corrective action based on the output, which may automatically be taken or which may be presented to the user for further action, etc.

Moreover, if desired, the knowledge discovery application 114 implementing the method 1100 may access the data explorer 155, the big data appliance 102 and the data modeling studio 109 as needed to acquire or use data models or to access data to be used by the data models or other components of the knowledge discovery method 1100. For example, the data knowledge application 114 may access one or more data models created using the data modeling studio 109 as well as access the run time engine 124 of the data modeling studio 109 in order to execute the one or more such data models using data from the plant 10 and/or from the big data appliance 102.

During operation, the data knowledge application 114 may generate and display a plurality of graphical depictions of data models that can be performed on data and may provide an interface into the data available within the plant (e.g., as stored in the big data appliance 102) to enable a user to view, specify or select which data to process and which data model or data models to use to process that data. Of course, as noted above, a data model may include any routine that models or estimates the operation of the process plant 10 or that performs an analysis of some aspect of the process run within the process plant 10 using collected process data or based on process data from a real or a simulated process. The data models used in the discovery method may be preconfigured models or may be models created using the data modeling studio 109, constructed of templates 129 and including one or more data source templates 129a, functional templates 129b, data flow templates 129d and/or data output templates 129c as described above. The data models may be retrieved from storage via a computer network (such as the process control system big data network backbone 105) or created as part of the knowledge discovery method 1100.

Referring again to FIG. 9, at a block 1102, a processor executing the knowledge discovery method 1100 may execute an instruction to present a user interface to a user to enable a user to view, drill down into and select one or more types of process data as stored in the big data appliance 102, as available from the plant 10, etc. This interface may illustrate the relationships between data as stored in or provided by plant configuration data, may enable a user to view the actual data or to view summary statistics of the data, etc. The interface may enable the user to view multiple different types of data or data streams simultaneously or to select different data streams from the plant for use in the knowledge discovery process. For example, the method may enable the user to use the data explorer 155 described above.

Thus, at the block 1102, the processor executing the method 1100 may execute an instruction to generate a data exploration interface that displays process control data stored on the big data appliance. The process control data may include configuration data defining hardware and software modules used in the process plant and the configured relationships between these elements. Hardware modules may include user interfaces, servers, databases, controllers, field devices, units, unit modules, equipment, equipment modules, and any other device used in the process plant 10. Software modules may include control software that controls the hardware, that directs data flow between the hardware and software modules, etc. and may include control routines, data collection routines, data retrieval routines, etc. The software modules may also include communication software that controls or directs communications within the plant 10, maintenance software that collects and processes data for maintenance purposes, business modules that process data to perform business functions, etc. Of course, the process control data may include process measurement data corresponding to values generated by or recorded within the hardware and software modules, for example, temperature values, pressure values, etc., controller data, such as control signals, etc. The process control data may also be streamed from one or more of the plurality of nodes 108 and/or the big data appliance 102.

The data knowledge application 114 may further integrate the process control data to allow this data to be viewed with data from multiple other process plant sources, non-process plant sources, external data sources, third party data sources etc. For example, the data from the big data appliance 102 of a first plant may be integrated with data from a big data appliance 102 of one or more other plants. In some embodiments, the process control data may be integrated with data from one or more process plants using other data schemas such as legacy schemas used in process plants. The data may further be integrated with third party data, for example environment data. The environment data may include weather data such as temperature, weather conditions, etc.

The data exploration interface may include hierarchical configuration data defining one or more hierarchical relationships between the hardware and software modules in the process plant. For example, the data exploration interface may define a particular process plant as well as the particular pieces of hardware and particular software routines used in that process plant. Process control data also includes connection data defining one or more interconnections between the hardware and software modules in the process plant, such as data collection, data retrieval, which control routines are disposed in which controllers, etc.

Moreover, a block 1104 may operate to receive a user selection of one or more data models to be applied to the selected data or data streams. The selected data models may define processing routines to be performed on the one or more of the selected data sources, such as a data preprocessing routine (a clipping routine, an outlier removal routine, etc.), one or more functions to be performed on the selected data streams to produce an output (a correlation routine, an averaging routine, etc.) and/or one or more functions to be performed on the output of the data model, such as a graphical presentation, alarm, etc.

For example, the data processing techniques may remove noise, inconsistent data, outliers, etc. The data processing techniques may also include conversion routines that converts the preprocessed data into a data format compatible with a functional routine or block of a data model. Functions performed by the data models may include data mining techniques or other intelligent methods that determine or discover one or more data patterns.

In any event, as illustrated at a block 1106, the knowledge discovery application 114 may receive a selection of process control data defining one or more process data inputs to be processed by the selected data model(s). At a block 1108, the data model(s) are executed on the selected process control data to produce the output defined by the data models. The knowledge discovery application 114 may access the runtime engine 124 of the data modeling studio 109 and use the model execution routine 128 of the runtime engine 124 to execute the data models. At a block 1110, the data knowledge application 114 may generate an output exploration interface that allows a user to view the output produced by the data model. More specifically, the output exploration interface may display a graphic representation of the output produced by the model, relationships between the output and the hardware and software modules in the process plant, other potentially relevant data, etc.

The output exploration interface allows the user to evaluate patterns and to identify desired or meaningful data patterns, relationships, etc. In some embodiments, a user may make an input indicating a selection of a desired data patterns and the knowledge discovery application 114 may execute one or more data models to search for pairs or groups of data that exhibit that relationship. For example, a user may make an input indicating a selection to identify data patterns relating to the quality of a product, or patterns between alarms and temperature. One or more predictions may be made based on the results and/or visualized data.

The knowledge discovery method 1100 may also iteratively execute the steps 1102-1110 of FIG. 9. For example, based on the output of a first execution of the model, a user may wish to run the selected data model on additional process control data after the first execution of the model, execute a different model on the same process control data, etc. In this manner, the method 1100 may be iterative and allow a user to leverage the process control data of the big data appliance 102, to quickly and efficiently execute models.

Because the knowledge discovery application 114 has access to the comprehensive, high fidelity data stored in the big data machine 102, it is not necessary to define any or all of the various parameters of a process plant to be collected and used in the knowledge discovery method 110 before running the method. Thus, the knowledge discovery application 114 does not require users to select the data they want first and configure plant equipment to collect that desired data prior to processing the data. Instead, if a user, running the knowledge discovery method described herein selects data to run on some models and later determines that additional data is necessary, the user does not have to reconfigure the plant to collect the new data and operate the plant to collect the new data (a process that could take anywhere from a few weeks to a few months) because the new data is immediately available in the big data machine 102. Because users rarely know all of the data that may be needed to create a model for a process at the onset of creating the model, much less at the outset of configuring the plant, the knowledge discovery application 114 facilitates fast and efficient complex process modeling and analysis.

If desired, the processor running the knowledge discovery application 114 may also execute one or more instructions to automatically access one or more devices via the big data network backbone 105 and execute a command to affect the actual operation of the process plant based on the output of the knowledge discovery application 114. However, it may be dangerous to allow the knowledge discovery application 114 to automatically implement changes. Accordingly, an automated system associated with or provided as part of the application 114 may alert an operator, an engineer or another user with the results of the pattern evaluation and/or predictions as well as one or more potential solutions or configuration changes which the user can make based on the pattern evaluation.

At a block 1112, the results of the knowledge discovery may be stored or otherwise integrated into the process control system. For example, data presented from the pattern evaluation may be input back into the plant and automatically tied back into one or more control strategies executing within the plant. One or more patterns determined by the process may be saved in the big data appliance 102 or the data modeling studio 109 as a template for future use or access. The output of the knowledge discovery process may be uploaded and/or saved in another part of the plant, such as a controller, data analysis engine, etc. The data model may be loaded into one or more parts of the online plant and executed in the plant in the on-line runtime environment.

The following additional considerations apply to the foregoing discussion. Throughout this specification, plural instances may implement components, operations, or structures described as a single instance. Although individual operations of one or more routines or methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter of the present disclosure.

Additionally, certain embodiments are described herein as including logic or a number of components, modules, or mechanisms or units. Modules and units may constitute either software modules (e.g., code stored on a non-transitory machine-readable medium) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

A hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also include programmable logic or circuitry (e.g., as encompassed within a general-purpose processor or other programmable processor) that is temporarily configured by software to perform certain operations. It will be appreciated that the decision to implement a hardware module in dedicated and permanently configured circuitry or in temporarily configured circuitry (e.g., configured by software) may be driven by cost and time considerations.

Accordingly, the hardware terms used herein should be understood to encompass tangible entities, be that entities that are physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware and software modules can provide information to, and receive information from, other hardware and/or software modules. Accordingly, the described hardware modules may be regarded as being communicatively coupled. Where multiple of such hardware or software modules exist contemporaneously, communications may be achieved through signal transmission (e.g., over appropriate circuits, lines and buses) that connect the hardware or software modules. In embodiments in which multiple hardware modules or software are configured or instantiated at different times, communications between such hardware or software modules may be achieved, for example, through the storage and retrieval of information in memory structures to which the multiple hardware or software modules have access. For example, one hardware or software module may perform an operation and store the output of that operation in a memory device to which it is communicatively coupled. A further hardware or software module may then, at a later time, access the memory device to retrieve and process the stored output. Hardware and software modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, include processor-implemented modules.

Similarly, the methods or routines described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "application," an "algorithm" or a "routine" is a self-consistent sequence of operations or similar processing leading to a desired result. In this context, applications, algorithms, routines and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" is employed to describe elements and components of the embodiments herein. This is done merely for convenience and to give a general sense of the description. This description should be read to include one or at least one and the singular also includes the plural unless it is obvious that it is meant otherwise.

Upon reading this disclosure, those of skill in the art will appreciate still additional alternative structural and functional designs for implementing a data modeling studio for configuring and executing models as disclosed herein. Thus, while particular embodiments and applications have been illustrated and described herein, it is to be understood that the disclosed embodiments are not limited to the precise construction and components disclosed herein. Various modifications, changes and variations, which will be apparent to those skilled in the art, may be made in the arrangement, operation and details of the methods and structure disclosed herein without departing from the spirit and scope defined in the claims.

What is claimed is:

1. A computer system for facilitating graphical construction of a data model, wherein the data model analyzes data from a process plant to produce an output, the computer system comprising:
   a non-transitory computer readable memory that stores a plurality of data model templates including (i) one or more data source templates defining data sources within the process plant with a data source output that provides data from the defined data source, (ii) one or more functional templates defining data processing routines to be performed on data retrieved from the data sources with a functional template output derived from the data processing routines, (iii) one or more data output templates indicating output processing to be performed on the functional template outputs, and (iv) one or more data flow interconnections that define flow of data among the data sources, processing routines, and output processing defined by the plurality of data model templates;
   a configuration engine that operates on a computer processing device, including;
      an interface routine that generates, via a user interface device:
         a library region that displays graphical depictions of the plurality of data model templates including the data source templates, the functional templates, the data output templates, and the one or more data flow interconnections; and
         a canvas region that receives and displays user selections of the graphical depictions of one or more selected data model templates including one or more selected data source templates, one or more selected functional templates, one or more selected data output templates, and one or more selected data flow interconnections;
      wherein the configuration engine further operates to execute a software routine to enable a user to modify the selected data model templates depicted in the canvas region by defining specific parameters to be used in the selected data model templates, to create interconnected blocks forming a data model having one or more configured data source templates, one or more configured functional templates and one or more configured data output templates interconnected with configured data flow interconnections; and
   a runtime engine that operates on a computer processing device to execute the data model, wherein the execution of the data model includes flow of data between the data sources defined by the one or more configured data source templates, the data processing routines defined by the one or more configured functional templates of the data model, and the output processing defined by the one or more configured data output templates of the data model as defined by the one or more configured data flow interconnections of the data model.

2. The computer system of claim 1, wherein at least one of the data sources defined by the one or more data source templates is a data source comprising historical data representing past operation of the process plant.

3. The computer system of claim 2, wherein the historical data includes one or more indications of user actions that occurred during past operation of the process plant.

4. The computer system of claim 2, wherein the historical data includes network management or network traffic data associated with the process plant.

5. The computer system of claim 1, wherein at least one of the data sources defined by the one or more data source templates is a data source external from the process plant.

6. The computer system of claim 1, wherein at least one of the functional templates defines a correlation routine.

7. The computer system of claim 6, wherein the data model executes to determine a correlation or a lack of correlation between two or more measures defined by the one or more configured data source templates.

8. The computer system of claim 1, wherein the data model executes to produce an output in the form of one or more potential user actions to incorporate into the process plant.

9. The computer system of claim 1, wherein the data model executes to produce an output in the form of one or more parameter values.

10. The computer system of claim 1, wherein the data model executes to produce an output in the form of one or more alerts to send to one or more users.

11. The computer system of claim 1, wherein the data sources defined by the one or more data source templates include one or more data sources not located in a controller or field device controlling a process within the process plant.

* * * * *